(12) United States Patent
Arai

(10) Patent No.: US 6,329,688 B1
(45) Date of Patent: Dec. 11, 2001

(54) NONVOLATILE SEMICONDUCTOR MEMORY DEVICE AND METHOD OF MANUFACTURING THE SAME

(75) Inventor: Hajime Arai, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/037,031

(22) Filed: Mar. 9, 1998

(30) Foreign Application Priority Data

Sep. 4, 1997 (JP) .................................................... 9-239582

(51) Int. Cl.⁷ .................................................... H01L 29/788
(52) U.S. Cl. .................... 257/320; 257/316; 257/324; 438/257
(58) Field of Search .................... 257/316, 324, 257/319, 320; 438/257

(56) References Cited

U.S. PATENT DOCUMENTS

| 5,036,378 | | 7/1991 | Lu et al. | 257/317 |
| 5,053,841 | * | 10/1991 | Miyakawa et al. | 257/318 |
| 5,070,032 | | 12/1991 | Yuan et al. | 438/267 |
| 5,095,344 | * | 3/1992 | Harari | 257/328 |
| 5,252,846 | * | 10/1993 | Tanaka et al. | 257/317 |
| 5,500,816 | * | 3/1996 | Kobayashi | 365/185 |
| 5,703,388 | * | 12/1997 | Wang et al. | 257/315 |
| 5,729,035 | * | 3/1998 | Anma | 257/324 |
| 5,787,034 | * | 7/1998 | Omino et al. | 365/185.02 |
| 5,838,039 | * | 11/1998 | Sato et al. | 257/321 |

FOREIGN PATENT DOCUMENTS

| 047 153 A1 | 3/1982 | (EP) . | |
| 282 022 A2 | 9/1988 | (EP) . | |
| 59-58868 | 4/1984 | (JP) . | |
| 63-244364 | 9/1988 | (JP) . | |
| 1-241177 | 9/1989 | (JP) . | |
| 4-04-025078 | * | 1/1992 | (JP) ............................. H01L/29/788 |
| 09036257 A | 2/1997 | (JP) . | |

* cited by examiner

Primary Examiner—Jerome Jackson, Jr.
Assistant Examiner—George C. Eckert, II
(74) Attorney, Agent, or Firm—McDermott, Will & Emery

(57) ABSTRACT

A nonvolatile semiconductor memory device includes a silicon substrate, a floating gate electrode formed on silicon substrate with a silicon oxide film therebetween, a control gate electrode formed on a portion of floating gate electrode with an interlayer insulating film therebetween, and an erase electrode formed on another portion of floating gate electrode with an insulating film therebetween. The insulating film includes a silicon nitride film and a silicon oxide film.

8 Claims, 23 Drawing Sheets

NONVOLATILE SEMICONDUCTOR MEMORY DEVICE AND METHOD OF MANUFACTURING THE SAME

BACKGROUND OF THE INVENTION

1. Field of the Invention

The present invention relates to a method of manufacturing a nonvolatile semiconductor memory device and a method of manufacturing the same, and in particular relates to an EEPROM (Electrically Erasable and Programmable Read Only Memory) allowing electrical erasing and writing, and more particularly to a so-called flash memory as well as a method of manufacturing the same.

2. Description of the Background Art

An EEPROM, which allows free programming of data and also allows electrical writing and erasing of information, has been known as a kind of nonvolatile semiconductor memory device. The EEPROM has an advantage that both writing and erasing can be electrically performed, but has a disadvantage that high density integration is difficult because two transistors, i.e., a select transistor and a memory cell transistor are required in a memory cell. In view of this, a flash memory which requires one transistor for each memory cell and allows electrical erasing of entire written information charges at a time has been proposed.

FIG. 38 is a block diagram showing a general structure of a flash memory of a NOR type. Referring to FIG. 38, the flash memory includes a memory cell matrix 1100, an X-address decoder 1200, a Y-gate 1300, a Y-address decoder 1400, an address buffer 1500, a write circuit 1600, a sense amplifier 1700, an I/O buffer 1800 and a control logic 1900.

Memory cell matrix 1100 internally has a plurality of memory cell transistors arranged in rows and columns. Memory cell matrix 1100 is connected to X-address decoder 1200 and Y-decoder 1300. X-address decoder 1200 and Y-gate 1300 are operable to select the row and column in memory cell matrix 1100, respectively. Y-gate 1300 is connected to Y-address decoder 1400. Y-address decoder 1400 is operable to provide apply information for selecting the column. X-address decoder 1200 and Y-address decoder 1400 are connected to address buffer 1500. Address buffer 1500 is operable to store temporarily address information.

Y-gate 1300 is connected to write circuit 1600 and sense amplifier 1700. Write circuit 1600 is operable to perform a write operation during input/output of data. Sense amplifier 1700 is operable to determine "0" and "1" from a value of current which flows during the data output. Write circuit 1600 and sense amplifier 1700 each are connected to an I/O buffer 1800. I/O buffer 1800 is operable to store temporarily the input/output data.

Address buffer 1500 and I/O buffer 1800 are connected to a control logic 1900. Control logic 1900 is operable to control an operation of the flash memory. Control logic 1900 performs control based on a chip enable signal /CE, an out-chip enable signal /OE and a program signal. The character "/" in the reference characters such as "/CE" means the inversion or inverted state.

FIG. 39 is an equivalent circuit diagram showing a schematic structure of memory cell matrix 1100 shown in FIG. 38. Referring to FIG. 39, a plurality of word lines $WL_1$, $WL_2$, ... $WL_i$ and a plurality of bit lines $BL_1$, $BL_2$, ... $BL_j$ which extend perpendicularly to the word lines to form a matrix are arranged in memory cell matrix 1100. The plurality of word lines $WL_1$, $WL_2$, ... $WL_i$ are connected to X-address decoder 1200 and extend in the row direction. The plurality of bit lines $BL_1$, $BL_2$, ... $BL_j$ are connected to Y-gate 1300 and extend in the column direction.

Memory transistors Q11, Q12, ... Qij are arranged at crossings between the word lines and bit lines, respectively. A drain of each memory cell is connected to the corresponding bit line. A control gate of each memory transistor is connected to the corresponding word line. Sources of the memory transistors are connected to corresponding source lines S1, S2, ... Si. The source lines of the memory transistors belonging to the same row are connected together.

A structure of the memory transistor forming the conventional flash memory will now be described below.

FIG. 40 is a fragmentary plan showing a schematic structure of memory matrix 1100 of the conventional NOR-type flash memory. FIG. 41 is a cross section taken along line D–D' in FIG. 40.

Referring primarily to FIG. 41, a p-type silicon substrate 1001 has a main surface, on which drain diffusion regions 1013 and source diffusion regions 1012 spaced by a predetermined distance are formed to define channel regions 1002 therebetween. A floating gate electrode 1004 is formed on each channel region 1002 with a thin oxide film 1003 of about 100 Å in film thickness therebetween. A control gate electrode 1006 is formed on each floating gate electrode 1004 with an interlayer insulating film 1005 therebetween. Floating gate electrode 1004 and control gate electrode 1006 are made of polycrystalline silicon doped with impurity (which will be referred to as "doped polycrystalline silicon" hereinafter). p-type silicon substrate 1001, floating gate electrodes 1004 and control gate electrodes 1006 are covered with a thermal oxide film 1051. There is also formed a smooth coat film 1008 which is made of, e.g., an oxide film and covers floating gate electrodes 1004 and control gate electrodes 1006.

Smooth coat film 1008 is provided with contact holes each reaching a portion of the surface of source diffusion region 1012. Bit lines 1052 are formed over smooth coat film 1008 and are connected to source diffusion regions 1012 through contact holes 1009, respectively.

Referring primarily to FIG. 40, the plurality of word lines 1006 and the plurality of bit lines 1052 are perpendicular to each other. Word line 1006 is formed integrally with control gate electrode 1006. Floating gate electrode 1004 is formed at the crossing between word line 1006 and bit line 1052, and more specifically is located under control gate electrode 1006. Two floating gate electrodes 1004 which neighbor to each other in the column direction are covered by a common LOCOS (Local Oxidation of Silicon) film 1053.

Referring to FIG. 42, description will be given on a write operation of the NOR-type flash memory utilizing channel hot electrons. A voltage $V_{D1}$ from about 4 to about 6 V is applied to drain diffusion region 1013, and a voltage $V_{G1}$ from about 10 to about 15 V is applied to control gate electrode 1006. Voltages $V_{D1}$ and $V_{G1}$ thus applied generate a large number of high energy electrons at the vicinities of drain diffusion region 1013 and oxide film 1003. A part of the electrons are injected into floating gate electrode 1004. When floating gate electrode 1004 accumulates the electrons in this manner, a threshold voltage $V_{TH}$ of the memory transistor increases. The state in which threshold voltage $V_{TH}$ exceeds a predetermined value is a written state and is called a state of "0".

Referring to FIG. 43, description will be given on an erasing operation utilizing a F-N (Fowler-Nordheim) tunneling phenomenon. A voltage $V_S$ from about 10 to about 12

V is applied to source diffusion region 1012, control gate electrode 1006 is set to a ground potential, and drain diffusion region 1013 is held at a floating state. Owing to an electric field formed by voltage $V_S$ applied to source diffusion region 1012, the F-N tunneling phenomenon occurs, and thereby the electrons in floating gate electrode 1004 pass through thin oxide film 1003. In this manner, the electrons are extracted from floating gate electrode 1004, so that threshold voltage $V_{TH}$ of the memory transistor lowers. The state in which the threshold voltage is lower than the predetermined value is the erased state, and is also called a state of "1".

In the read operation, as shown in FIG. 41, a voltage $V_{G2}$ of about 5 V is applied to control gate electrode 1006, and a voltage $V_{D2}$ from about 1 to about 2 V is applied to drain diffusion region 1013. In this case, the foregoing determination of "1" and "0" is performed based on whether a current flows through the channel region of the memory transistor or not, and in other words, whether the memory transistor is on or off. Thereby, reading of information is performed. The flash memory described above requires the high voltages during the operation as described above. Therefore, it is required to provide a power supply system for high voltages used for erasing independently of a power supply system for a power supply voltage used for ordinary reading in many cases. A flash memory of a DINOR (divided-Bit Line NOR) type suffers from a similar disadvantage.

In order to overcome the above disadvantage, an EEPROM using an injection gate has been proposed in Japanese Patent Laying-Open No. 59-58868 (1984).

FIG. 44 is a cross section of a NOR-type EEPROM using an injection gate disclosed in the above publication. Referring to FIG. 44, a semiconductor substrate 2001 is provided with a source a drain which are diffusion layers of a conductivity type opposite to that of semiconductor substrate 2001. A channel 2004 is formed by ion-implantation of impurity of a conductivity type opposite to that of semiconductor substrate 2001. Channel 2004 is operable to provide continuity between the source and drain of the transistor when no carrier is accumulated in floating gate 2006. Control gate 2008 and floating gate 2006 are capacity-coupled together through a thin insulating film 2007. Injection gate 2008' and floating gate 2006 are capacity-coupled together through a thin insulating film 2013. Oxide film 2007 has a thickness from about 100 to about 500 Å, and oxide film 2013 has a thickness of 100 Å or less.

In the erasing operation of the EEPROM thus constructed, a positive voltage is applied to injection gate 2013, whereby electrons tunnel from floating gate 2006 into injection gate 2008', so that the accumulated carriers disappear and the state of "0" is attained.

In the above EEPROM, however, the oxide film under the injection gate is thin. Therefore, the erasing operation can be performed easily, but a leak current is liable to occur at the oxide film. The DINOR-type flash memory suffers from a similar problem.

For overcoming the above problems, the inventors and others have proposed the following EEPROM. FIG. 45 is a cross section of the EEPROM proposed by the inventors and others. Referring to FIG. 45, isolating oxide films 3002 spaced from each other are formed on a silicon substrate 3001. Active regions are formed between isolating oxide films 3002, and gate oxide films 3003 are formed at the active regions, respectively. A floating gate electrode 3004 made of doped polycrystalline silicon is formed on each gate oxide film 3003. Floating gate electrodes 3004 are isolated from each other by isolating oxide films 3002. An interlayer insulating film 3005 formed of a gate oxide film 3005a, a silicon nitride film 3005b and a gate oxide film 3005c is formed on floating gate electrode 3004. An erase electrode 3009 located between neighboring floating gate electrodes 3004 and more specifically above isolating oxide film 3002 is formed on interlayer insulating film 3005 for extracting electrons accumulated in floating gate electrode 3004. An interlayer insulating film 3010 is formed at the surface of erase electrode 3009. Erase electrodes 3009 as well as interlayer insulating films 3005 and 3010 are covered with a control gate electrode 3006. Control gate electrode 3006 is formed of a doped polycrystalline silicon layer 3006a and a silicide layer 3006b made of tungsten silicide or molybdenum silicide.

In this EEPROM, since interlayer insulating film 3005 has a three-layer structure, a leak current is unlikely to occur when it is used as the EEPROM of the NOR type, but such a problem arises that erase electrode 3009 cannot easily extract the electrons accumulated in floating gate electrode 3004. In the case of the DINOR type, erase electrode 3009 cannot easily inject the electrons into floating gate electrode 3004 for erasing. Thus, it becomes difficult to extract and inject electrons for erasing if it is designed to suppress volatilization of data. If it is designed to allow easy extraction and injection of electrons, a leak current is liable to occur and therefore data is liable to volatilize.

SUMMARY OF THE INVENTION

Accordingly, the invention has been developed to overcome the aforementioned problems, and it is an object of the invention to provide a nonvolatile semiconductor memory device, which allows easy extraction and injection of electrons, and can suppress occurrence of a leak current and volatilization of data.

A nonvolatile semiconductor memory device according to the invention includes a semiconductor substrate, a floating gate electrode, a control gate electrode and an erase electrode. The floating gate electrode is formed on the semiconductor substrate with a first insulating film therebetween. The control gate electrode is formed on a portion of the floating gate electrode with a second insulating film therebetween. The erase electrode is formed on another portion of the floating gate electrode with a third insulating film therebetween. The third insulating film includes a silicon nitride film and a silicon oxide film.

In the nonvolatile semiconductor memory device having the above structure, the erase electrode is formed on the floating gate electrode with the third insulating film therebetween. The third insulating film includes the silicon nitride film, which does not form an insulating film for holes but forms an insulating film for electrons, and the silicon oxide film, which forms an insulating film for both the holes and electrons. Therefore, when a positive potential is applied to the silicon nitride film, the holes pass through the silicon nitride film, so that only the silicon oxide film functions as the insulating film. Accordingly, the tunneling phenomenon through the silicon oxide film is likely to occur, which allows easy extraction of electrons from the floating gate electrode or injection of electrons into the floating gate electrode. When electrons are already accumulated in the floating gate electrode, many holes are not present in the silicon nitride film unless the silicon nitride film carries a position potential. Therefore, both the silicon nitride film and the silicon oxide film form as the insulating films.

Accordingly, occurrence of the leak current and therefore volatilization of data can be suppressed.

In a nonvolatile semiconductor memory device according to an aspect of the invention, the silicon oxide film is formed on the floating gate electrode, the silicon nitride film is formed on the silicon oxide film and the erase electrode is formed on the silicon nitride film. In this case, if the erase electrode carries the positive potential, the silicon nitride film likewise carries the positive potential, and many holes are present in the silicon nitride film. Therefore, these holes pass through the silicon nitride film, resulting in reduction in insulating property of the silicon nitride film. As a result, only the silicon oxide film functions as the insulating film, and the electrons in the floating gate electrode are liable to be extracted into the erase electrode through the silicon oxide film owing to the tunneling phenomenon. Consequently, a NOR-type device can easily perform the erase operation. When electrons are held in the floating gate electrode, many holes are not present in the silicon nitride film unless the erase electrode on the silicon nitride film carries the positive potential. Therefore, both the silicon nitride film and the silicon oxide film function as the insulating film. Accordingly, the electrons do not flow externally from the floating gate electrode, and volatilization of data is suppressed.

In a nonvolatile semiconductor memory device according to still another aspect of the invention, the silicon nitride film is formed on the floating gate electrode, the silicon oxide film is formed on the silicon nitride film, and the erase electrode is formed on the silicon oxide film. In this structure, many holes are present in the silicon nitride film if the floating gate electrode carries the positive potential, and these holes pass through the silicon nitride film. Therefore, the insulating property of the silicon nitride film lowers, and only the silicon oxide film forms the insulating film. As a result, electrons in the erase electrode can be easily injected into the floating gate electrode through the silicon oxide film owing to the tunneling phenomenon. As a result, the device of the DINOR type can easily perform the erase operation. When the electrons are held in the floating gate electrode, the silicon nitride film carries the negative potential, so that presence of holes in the silicon nitride film is suppressed. Therefore, both the silicon nitride film and the silicon oxide film form the insulating film, and the electrons do not flow externally from the floating gate electrode. As a result, volatilization of data is suppressed.

Preferably, the second insulating film includes a first silicon oxide film, the silicon nitride film formed on the first silicon oxide film and a second silicon oxide film formed on the silicon nitride film, and the third insulating film includes the first silicon oxide film formed on the floating gate electrode, and said silicon nitride film formed on the first silicon oxide film. In this case, each of the second and third insulating films is formed of the first silicon oxide film and the silicon nitride film formed on the first silicon oxide film, so that the second and third insulating films can be manufactured in the same step. Consequently, manufacturing steps can be small in number.

Preferably, the second insulating film includes a first silicon oxide film, the silicon nitride film formed on the first silicon oxide film, and a second silicon oxide film formed on the silicon nitride film, and the third insulating film includes the silicon nitride film formed on the floating gate electrode, and the second silicon oxide film formed on the silicon nitride film. In this case, since each of the second and third insulating films includes the silicon nitride film and the second silicon oxide film formed on the silicon nitride film, the second and third insulating films can be manufactured in the same step. Therefore, manufacturing steps can be small in number.

Preferably, the nonvolatile semiconductor memory device further includes an isolating oxide film for isolating the memory cells from each other, and the erase electrode is formed on the isolating oxide film.

Preferably, the nonvolatile semiconductor memory device includes a plurality of the floating gate electrodes, and the erase electrode is arranged between the floating gate electrodes neighboring to each other.

Preferably, the control gate electrode is formed on the erase electrode.

A method of manufacturing a nonvolatile semiconductor memory device according to the invention includes the steps of forming a floating gate electrode on a semiconductor substrate with a first insulating film therebetween, successively forming a first silicon oxide film, a silicon nitride film and a second silicon oxide film in a layered form on the floating gate electrode, removing a portion of the second silicon oxide film opposed to the floating gate electrode, forming an erase electrode on the silicon nitride film located under the removed portion of the second silicon oxide film, and forming a control gate electrode on the second silicon oxide film.

According to the method of manufacturing the nonvolatile semiconductor memory device of the above aspect, the first silicon oxide film and the silicon nitride film are formed between the floating gate electrode and the control gate electrode, and simultaneously the first silicon oxide film and the silicon nitride film are formed between the floating gate electrode and the erase electrode. Therefore, the nonvolatile semiconductor memory device can be manufactured through simple steps. Since the silicon oxide film is formed on the floating gate electrode, the silicon nitride film is formed on the silicon oxide film, and the erase electrode is formed on the silicon nitride film. Therefore, the method can provide a NOR-type nonvolatile semiconductor memory device which allows easy extraction of electrons from the floating gate electrode and can suppress volatilization of data.

A method of manufacturing a nonvolatile semiconductor memory device according to another aspect of the invention includes the steps of forming a floating gate electrode on a semiconductor substrate with a first insulating film therebetween, forming a first silicon oxide film on a portion of the floating gate electrode, forming a silicon nitride film on the first silicon oxide film and another portion of the floating gate electrode, forming a second silicon oxide film on the silicon nitride film, forming an erase electrode on the second silicon oxide film, and forming a control gate electrode on the second silicon oxide film.

According to the method of manufacturing the nonvolatile semiconductor memory device of the above aspect, the silicon nitride film and the second silicon oxide film are formed between the floating gate electrode and the control gate electrode, and simultaneously the silicon nitride film and the second silicon oxide film can be formed between the floating gate electrode and the erase electrode. Therefore, the nonvolatile semiconductor memory device can be manufactured through simple steps. Since the silicon nitride film is formed on the floating gate electrode, the second silicon oxide film is formed on the silicon nitride film, and the erase electrode is formed on the second silicon oxide film. Therefore, the method can provide a DINOR type nonvolatile semiconductor memory device which allows easy injection of electrons into the floating gate electrode and can suppress volatilization of data.

Preferably, the steps of forming the floating gate electrode and forming the first silicon oxide film include the step of forming a conductive film and a silicon oxide film in a layered form on the first insulating film and then selectively removing the conductive film and the silicon oxide film to form the floating gate electrode and the first silicon oxide film. In this case, since the first silicon oxide film can be formed simultaneously with formation of the floating gate electrode, the manufacturing steps can be further reduced in number.

The step of forming the floating gate electrode may include the step of forming a conductive film on the first insulating film and selectively removing the conductive film to form the floating gate electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1:
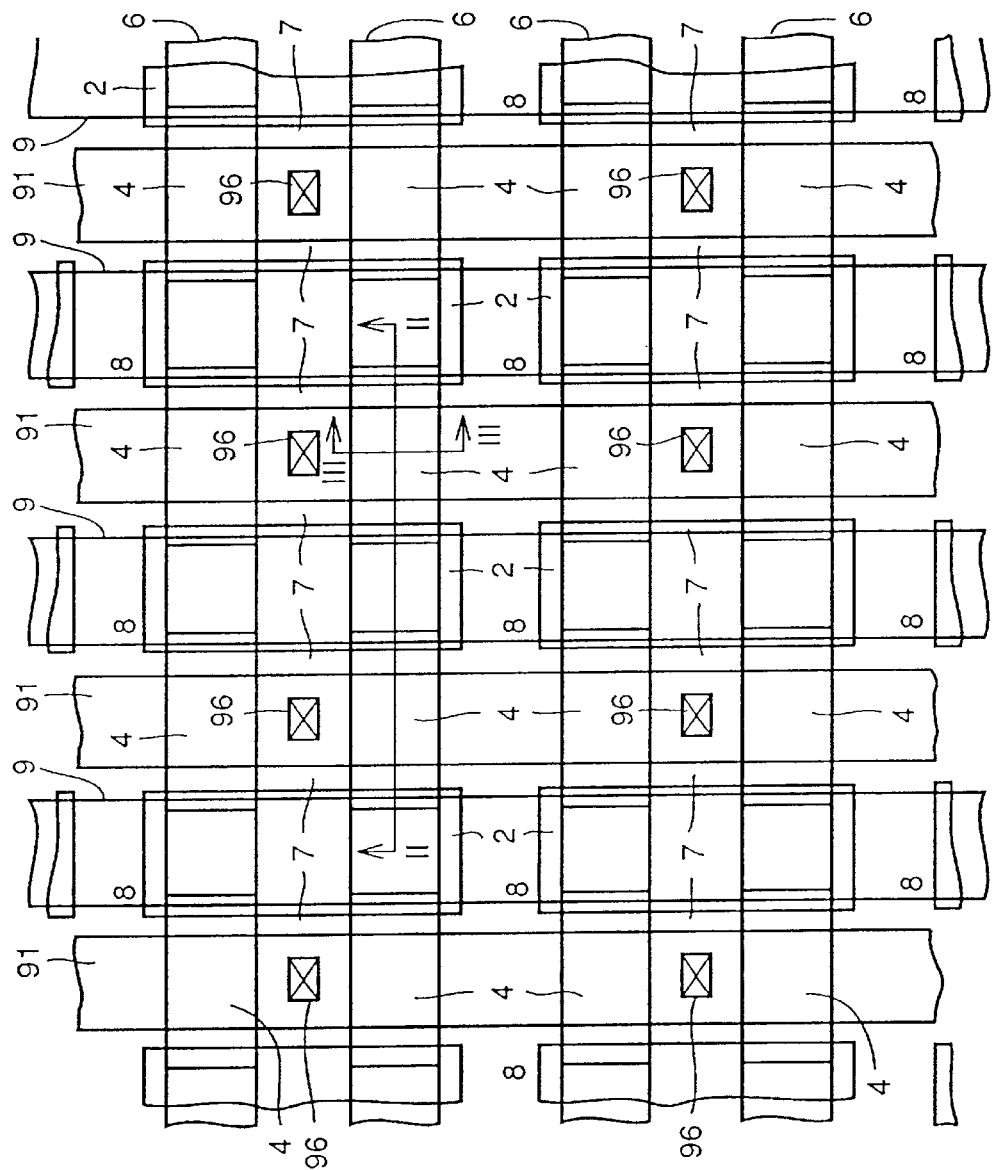
FIG. 1 shows a nonvolatile semiconductor memory device according to an embodiment 1 of the invention.
Figure 2:
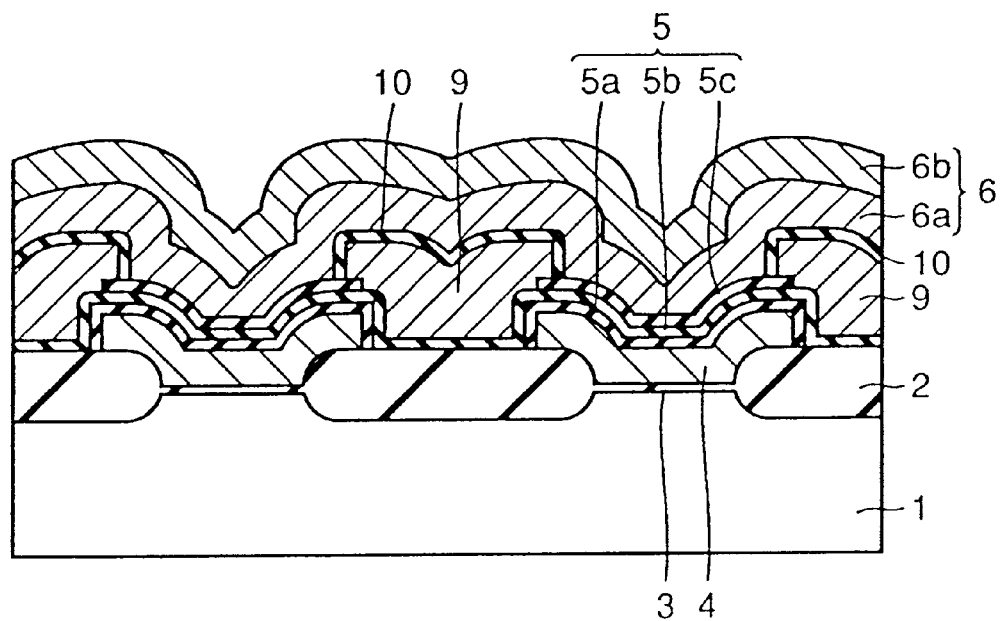
FIG. 2 is a cross section taken along line II—II in FIG. 1.
Figure 3:
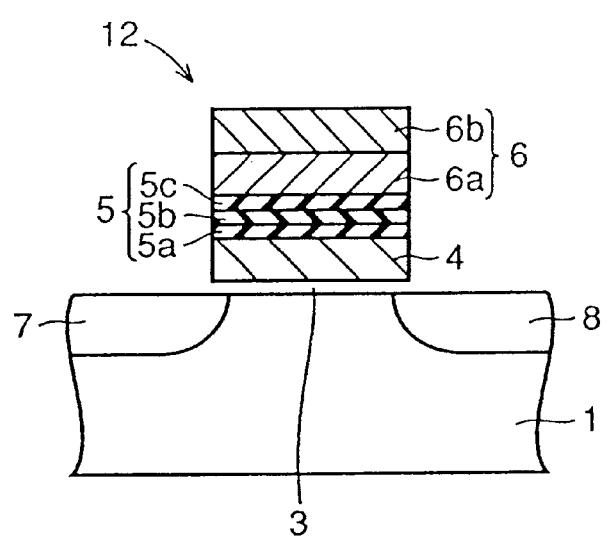
FIG. 3 is a cross section taken along line III—III in FIG. 1.

Referring to FIGS. 1 to 3, isolating oxide films 2 each having an island-like form and a thickness of 5000 Å are formed on silicon substrate 1. A region not covered with isolating oxide film 2 is an active region, which is provided with a gate oxide film 3 of 100 Å in thickness. As shown in FIG. 3, a source region 7 and a drain region 8, which are both formed by implanting ions of impurity into silicon substrate 1, are formed at opposite sides of each gate oxide film 3.

A floating gate electrode 4 having a thickness of 1000 Å and made of doped polycrystalline silicon is formed on gate oxide film 3. Each floating gate electrode 4 is formed on the active region and isolating oxide films 2. An interlayer insulating film 5 formed of a silicon oxide film 5a of 100 Å in thickness, a silicon nitride film 5b of 100 Å in thickness and a silicon oxide film 5c of 100 Å in thickness is formed on floating gate electrode 4.

Erase electrodes 9, which are made of doped polycrystalline silicon and extend laterally in FIG. 1, are formed at portions located above isolating oxide films 2 and between floating gate electrodes 4, respectively. Silicon oxide film 5a, silicon nitride film 5b and a natural oxide film 5d (not shown in FIGS. 2 and 3) are present between the erase electrode 9 and floating gate electrode 4. Erase electrode 9 is connected at its end to an aluminum interconnection (not shown). An interlayer insulating film 10 made of a silicon oxide film is formed on the surface of erase electrode 9.

Control gate electrodes 6 are formed in a direction perpendicular to the extending direction of erase electrode 9. Each control gate electrode 6 has a layered structure formed of a polycrystalline silicon layer 6a having a thickness of 1000 Å and made of doped polycrystalline silicon and a silicide layer 6b having a thickness of about 1000 Å and made of tungsten silicide or molybdenum silicide.

Interlayer insulating film 5 is present between control gate electrode 6 and floating gate electrode 4. Bit lines 91 extend perpendicularly to the extending direction of the control gate electrodes 6, and are connected to drain regions 7 through contact holes 96, respectively.

Figure 4:
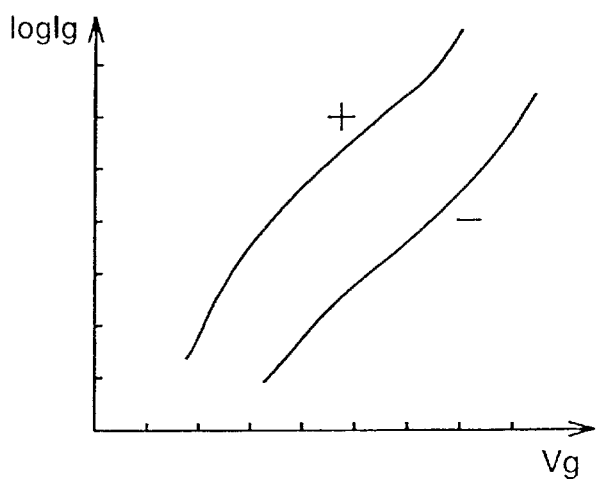
FIG. 4 is a graph showing a leak current value at an insulating film formed of a silicon nitride film and a silicon oxide film.

In FIG. 4, a line indicated by "+" represents characteristics which are exhibited when erase electrode 9 carries a positive potential and floating gate electrode 4 carries a negative potential, and a line indicated by "−" represents characteristics which are exhibited when erase electrode 9 carries a negative potential and floating gate electrode 4 carries a positive potential. As shown in FIG. 4, values of currents flowing through erase electrode 9 and floating gate electrode 4 depend on which of these electrodes is supplied with the positive potential. A larger current flows when erase electrode 9 is supplied with a positive potential compared with the case that erase electrode 9 is supplied with a negative potential.

Figure 5:
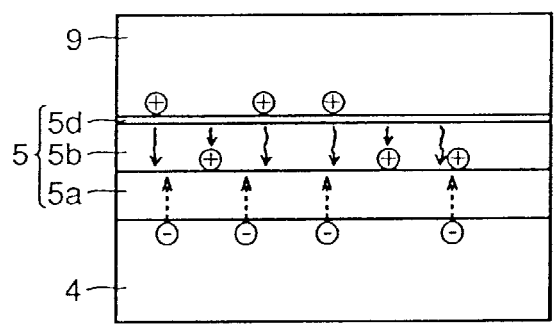
FIG. 5 schematically shows a mechanism of electrical conduction in the case where the silicon nitride film carries a positive potential.

As shown in FIG. 5. holes are gathered at an interface between erase electrode 9 and interlayer insulating film 5 when erase electrode 9 carries a positive potential. Natural oxide film 5d of 10 Å or less in thickness, which is produced by oxidation of silicon nitride film 5b, is present at the uppermost layer of the interlayer insulating film 5. However, natural oxide film 5d is extremely thin so that direct tunneling occurs, and the holes are injected into silicon nitride film 5b. Silicon nitride film 5b functions as an insulating film against electrons, but does not function as a perfect insulating film against holes. Owing to the Poole-Frenkel conduction mechanism, therefore, the holes move to the interface between silicon nitride film 5b and silicon oxide film 5a. A recoupling current flows owing to coupling of the holes at the interface between silicon nitride film 5b and silicon oxide film 5a with electrons tunneled through silicon oxide film 5a. Therefore, the current flow is promoted when erase electrode 9 carries the positive potential and floating gate electrode 4 carries the negative potential.

Figure 6:
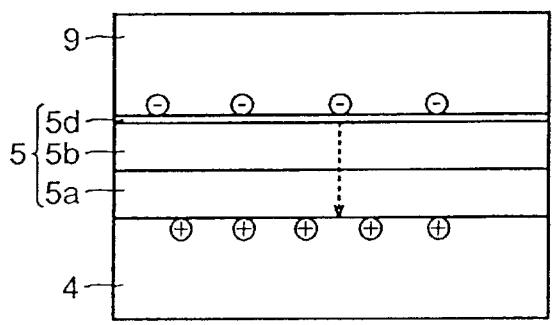
FIG. 6 schematically shows a mechanism of electrical conduction in the case where the silicon nitride film carries a negative potential.

As shown in FIG. 6, when erase electrode 9 carries a negative potential, electrons are accumulated at the interface between natural oxide film 5d and erase electrode 9, and holes are accumulated at the interface between silicon oxide film 5a and floating gate electrode 4, so that the electrons must tunnel through entire interlayer insulating film 5. Therefore, the value of current flowing through interlayer insulating film 5 is smaller than that in the case shown in FIG. 5. Thus, the current cannot flow easily when erase electrode 9 carries a negative potential and floating gate electrode 4 carries a positive potential.

Figure 7:
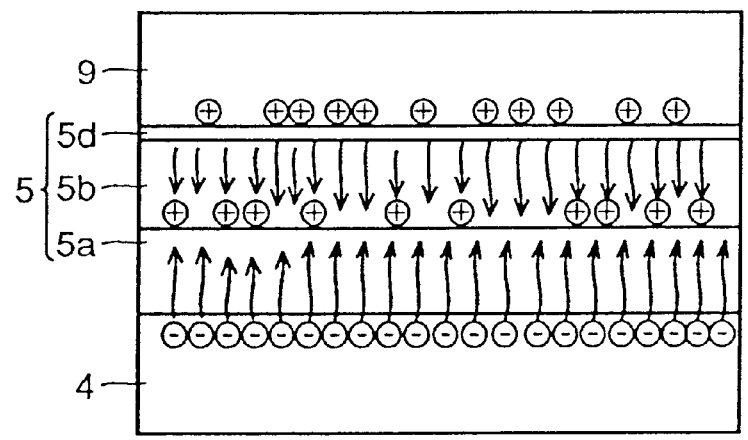
FIG. 7 schematically shows a mechanism of electrical conduction in an erase operation of the nonvolatile semiconductor memory device shown in FIGS. 2 and 3.

Referring to FIG. 7, when electrons are extracted from floating gate electrode 4, a voltage is applied to erase electrode 9, and silicon substrate 1, control gate electrode 6, source region 7 and drain region 8 are set to the ground potential. Thereby, holes are gathered between erase electrode 9 and natural oxide film 5d, and these holes move to the interface between silicon nitride film 5b and silicon oxide film 5a. Owing to recoupling of these holes with electrons in floating gate electrode 4, electrons are extracted from floating gate electrode 4.

Figure 8:
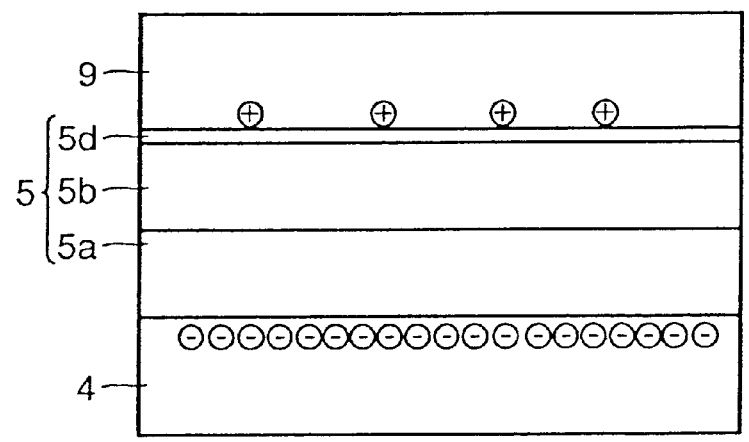
FIG. 8 schematically shows a state that a floating gate electrode holds electric charges in the nonvolatile semiconductor memory device shown in FIGS. 2 and 3.

Referring to FIG. 8, electric charges are accumulated in floating gate electrode 4. For holding these charges, the potential of erase electrode 9 is floated. Many holes are not present in erase electrode 9. Therefore, holes are not gathered at the interface between silicon oxide film 5a and silicon nitride film 5b. This suppresses external leak of electrons in floating gate electrode 4, and therefore suppresses volatilization of data. Since silicon nitride film 5b and erase electrode 9 are in contact with each other through a small area as shown in FIG. 2, volatilization of data is suppressed.

In the nonvolatile semiconductor memory device thus constructed according to the embodiment 1 of the invention, as shown in FIG. 7, electrons can be extracted easily with a low voltage. Further, as shown in FIG. 8, volatilization of data is suppressed if floating gate electrode 4 once holds the charges.

Embodiment 2

An embodiment 2 will now be described below in connection with a method of manufacturing the nonvolatile semiconductor memory device shown in FIG. 2.

Figure 9:
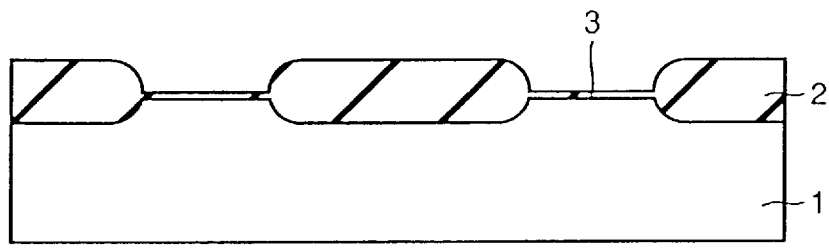
FIGS. 9 to 13 are cross sections showing first to fifth steps in a method of manufacturing a nonvolatile semiconductor memory device according to an embodiment 2.

Referring to FIG. 9, isolating oxide films 2 of 5000 Å in thickness are formed on silicon substrate 1 by the LOCOS method. Natural oxide films at the surface of silicon substrate and more specifically at regions (active regions) not bearing isolating oxide films 2 are removed with a hydrofluoric acid (HF) solution. Gate oxide film 3 of 100 Å in thickness is formed on the surface of silicon substrate 1 by a thermal oxidation method.

Figure 10:
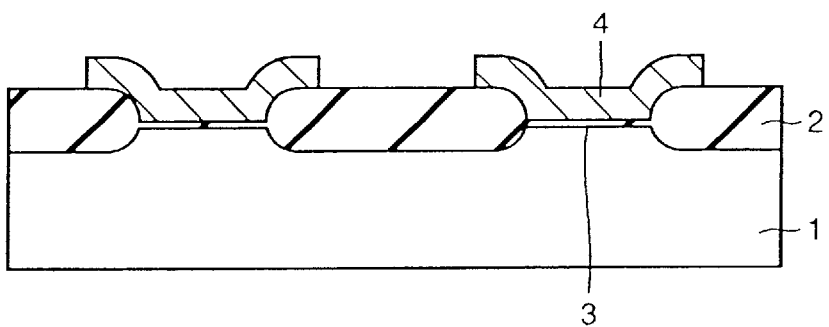

Referring to FIG. 10, a doped polycrystalline silicon film of 1000 Å in thickness is formed on gate oxide film 3 by a CVD (Chemical Vapor Deposition) method. The doped polycrystalline silicon film is patterned into a predetermined configuration. In this manner, floating gate electrodes 4 are formed.

Figure 11:
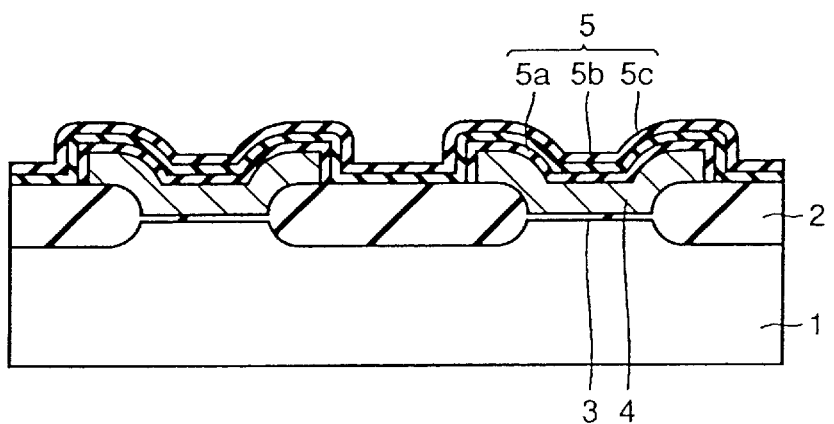

Referring to FIG. 11, a silicon oxide film 5a of 100 Å in thickness is formed by the thermal oxidation method. By the CVD method, silicon nitride film 5b of 100 Å in thickness is formed on silicon oxide film 5a. By the CVD method, silicon oxide film 5c of 100 Å in thickness is formed on silicon nitride film 5b. In this manner, interlayer insulating film 5 is completed.

Figure 12:
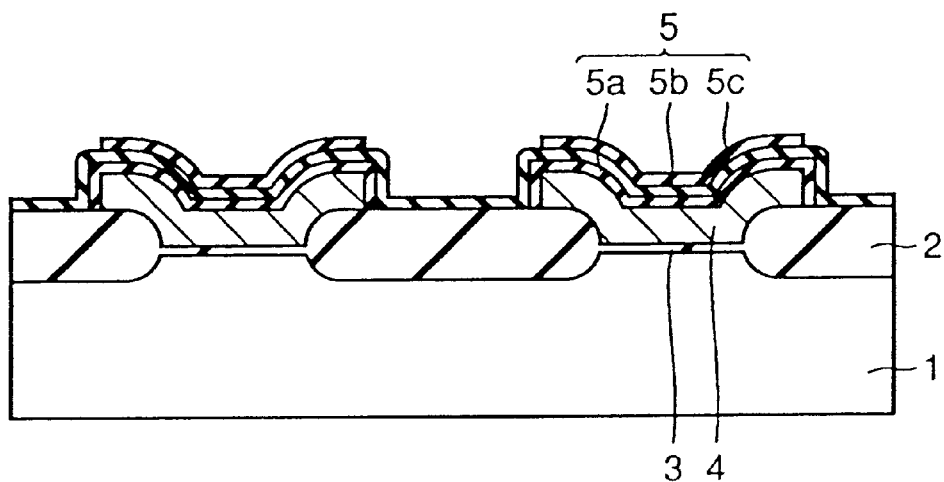

Referring to FIG. 12, photolithographic processing is performed to pattern silicon oxide film 5c into a predetermined configuration. Thereby, silicon oxide film 5c is removed from regions opposed to a portion of the upper surface of floating gate electrode 4 and the side surfaces of floating gate electrode 4.

Figure 13:
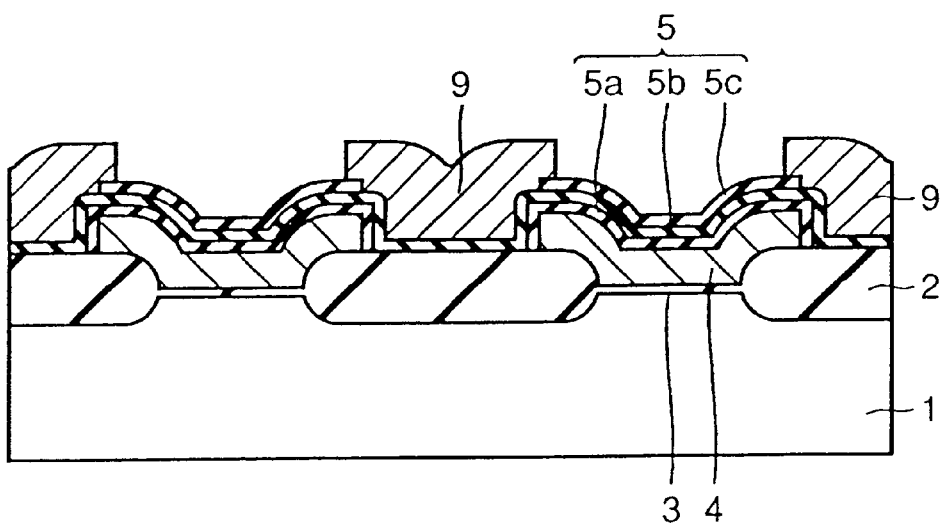

Referring to FIG. 13, a doped polycrystalline silicon film of 1500 Å in thickness is deposited on silicon substrate 1 by the CVD method. By the photolithographic processing, this doped polycrystalline silicon film is patterned into a predetermined configuration to form erase electrode 9 located above isolating oxide film 2 and more specifically between floating gate electrodes 4.

Referring to FIG. 13, a doped polycrystalline silicon film of 1500 Å in thickness is deposited on silicon substrate 1 by the CVD method. This doped polycrystalline silicon film is patterned into a predetermined configuration by the photolithographic processing, so that erase electrodes 9 located between floating gate electrodes 4 are formed on isolating oxide films 2, respectively.

Referring to FIG. 2, interlayer insulating film 10 of 500 Å in thickness is formed on erase electrode 9. A doped polycrystalline silicon layer of 1000 Å in thickness covering erase electrodes 9 and silicon oxide films 5c is formed by the CVD method. A silicide layer of 1000 Å in thickness made of tungsten silicide or molybdenum silicide is formed on the doped polycrystalline silicon layer by a sputtering method. The doped polycrystalline silicon layer and the silicide layer are patterned into a predetermined configuration so that control gate electrodes 6 each made of doped polycrystalline silicon layer 6a and silicide layer 6b is formed. Interlayer insulating film 10 and floating gate electrode 4 which are located under and masked with control gate electrode 6 are etched with a gas, e.g., of $CHF_3$ or $CF_4$. Finally, interconnections and contact holes for connection to silicon substrate 1 and control gate electrodes 6 are formed, and then a final protective film (not shown) is deposited so that the nonvolatile semiconductor memory device shown in FIG. 2 is completed.

Since the nonvolatile semiconductor memory device manufactured in the above method has the structure shown in FIG. 2, it allows easy extraction of electrons from the floating gate electrode and can suppress volatilization of data. Since the insulating film between floating gate electrode 4 and erase electrode 9 is formed by utilizing interlayer insulating film 5, the number of manufacturing steps does not increase significantly.

Embodiment 3

According to the nonvolatile semiconductor memory device shown in FIG. 2, silicon oxide film 5a is formed on a portion of the upper surface and the side surfaces of floating gate electrode 4, silicon nitride film 5b is formed on silicon oxide film 5a, and erase electrode 9 is formed on silicon nitride film 5b. In contrast to this, a nonvolatile semiconductor memory device shown in FIG. 14 has a structure in which silicon nitride film 5b is formed on a portion of the upper surface and the side surfaces of floating gate electrode 4, silicon oxide film 5c is formed on silicon nitride film 5b and erase electrode 9 is formed on silicon oxide film 5c. A cross section taken along line A—A in FIG. 14 is similar to that shown in FIG. 3.

Figure 14:
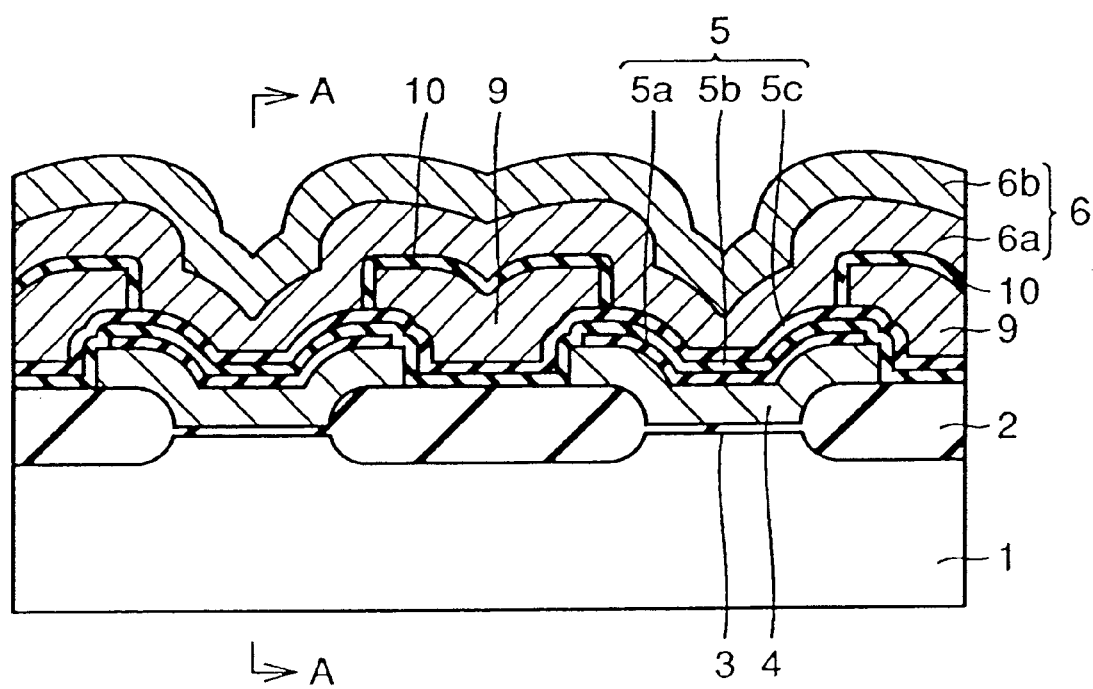
FIG. 14 is a cross section showing a nonvolatile semiconductor memory device according to an embodiment 3.

The nonvolatile semiconductor memory device shown in FIG. 14 is of the DINOR (Divided-Bit Line NOR) type. The nonvolatile semiconductor memory device of the DINOR type will now be described below.

Figure 15A:
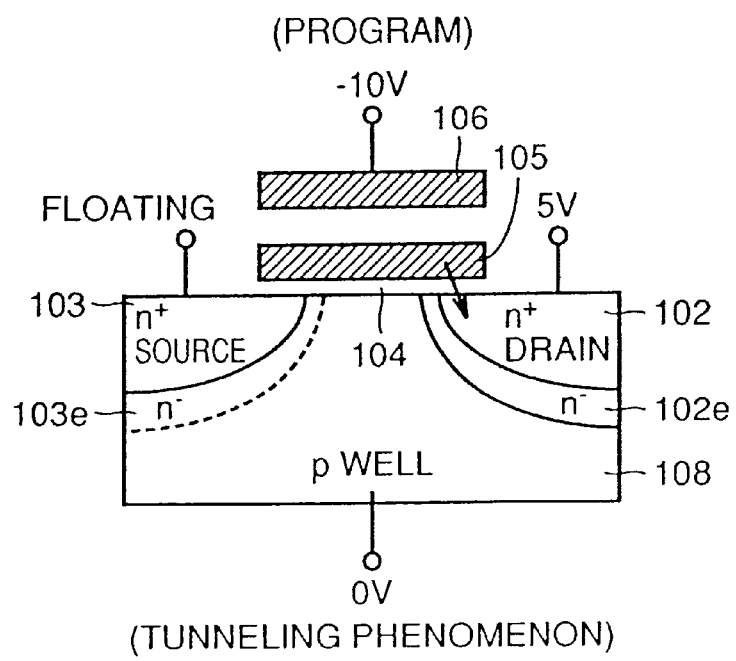
FIG. 15A is a diagram showing a write operation of a DINOR type nonvolatile semiconductor memory device.
Figure 15B:
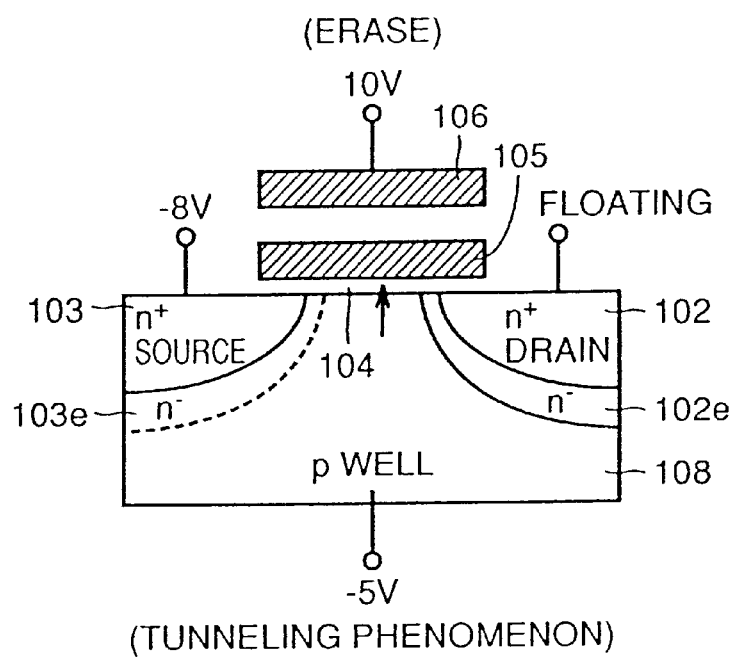
FIG. 15B is a diagram showing an erase operation of the DINOR type nonvolatile semiconductor memory device.

FIGS. 15A and 15B show write and erase operations, respectively. In FIGS. 15A and 15B, a drain region 102 which is a heavily doped n-type impurity region is formed at a p-well of a silicon substrate 108. A lightly doped n-type impurity region 102e is formed around drain region 102. A source region 103 which is a heavily doped n-type impurity region is formed at a p-well of silicon substrate 108. A lightly doped n-type impurity region 103e is formed around source region 103. A gate oxide film 104 is formed at a region on silicon substrate 108 located between drain and source regions 102 and 103. A floating gate electrode 105 is formed on gate oxide film 104, and a control gate electrode 106 is formed on floating gate electrode 105 with an insulating film therebetween.

In the write operation, as shown in FIG. 15A, a positive voltage, e.g., of 5 V is applied to drain region 102, and a negative voltage, e.g., of −10 V is applied to control gate 106. Source region 103 is floated, and 0 V is applied to the p-well of silicon substrate 108. Thereby, a high electric filed occurs between floating gate electrode 105 and drain region 102, and electrons are discharged from floating gate electrode 105 to drain region 102 owing to the tunneling phenomenon. As a result, the threshold voltage of the memory cell lowers.

For erasing, as shown in FIG. 15B, drain region 102 is floated, a high voltage, e.g., of 10 V is applied to control gate electrode 106, a negative voltage, e.g., of −5 V is applied to source region 103, and a negative voltage, e.g., of −5 V is applied to the p-well of silicon substrate 108. Thereby, a high voltage (15 V in this case) is applied across control gate electrode 106 and the p-well so that a high electric field occurs. As a result, the tunneling phenomenon occurs to inject electrons into floating gate electrode 105, and the threshold voltage of the memory cell rises.

Figure 16:
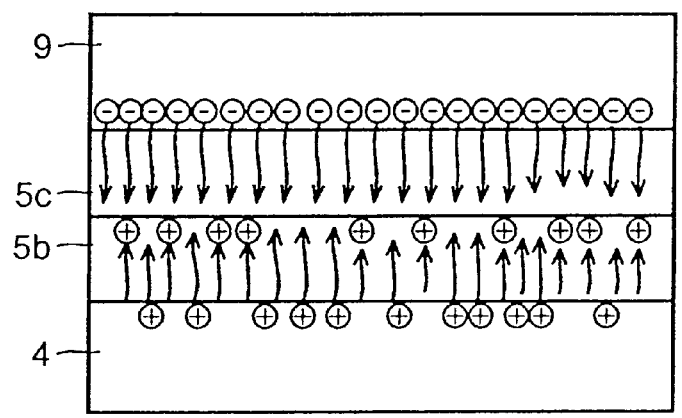
FIG. 16 schematically shows a mechanism of electrical conduction in the erase operation of the nonvolatile semiconductor memory device shown in FIG. 14.

The erase operation of the nonvolatile semiconductor memory device shown in FIG. 14 will be described below. Referring to FIG. 16, a positive potential, e.g., of 10 V is applied to control gate electrode 6. A negative potential, e.g., of −10 V is applied to erase electrode 9. Silicon substrate 1, source region 7 and drain region 8 are set to 0 V, 0 V and 0 V, respectively. As a result, holes in floating gate electrode 4 pass through silicon nitride film 5b and move to the interface between silicon nitride film 5b and silicon oxide film 5c. Meanwhile, electrons in erase electrode 9 move to the interface between erase electrode 9 and silicon oxide film 5c, and are coupled with holes at the interface between silicon oxide film 5c and silicon nitride film 5b, so that a recoupling current flows. As a result, electrons are injected into floating gate electrode 4.

Figure 17:
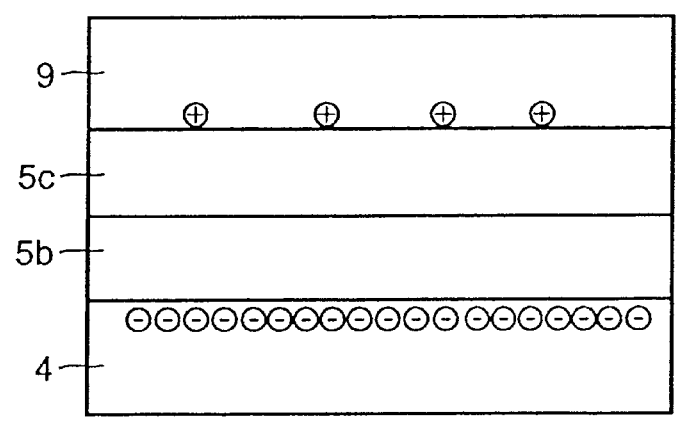
FIG. 17 schematically shows a state that a floating gate electrode holds electric charges in the nonvolatile semiconductor memory device shown in FIG. 14.

Referring to FIG. 17, while electrons are held in floating gate electrode 4, floating gate electrode 4 carries the negative potential. Erase electrode 9 is floated. Thereby, many holes are not present in erase electrode 9, so that holes do not move in silicon nitride film 5b. As a result, silicon nitride film 5b and silicon oxide film 5c function as the insulating film, and therefore suppress external flow of electrons accumulated in floating gate electrode 4. Consequently, volatilization of data is suppressed.

For writing, as shown in FIG. 15A, voltages of, e.g., 0 V, 5 V and −10 V are applied to silicon substrate 1, drain region 8 and control gate electrode 6, respectively, so that electrons are moved from floating gate electrode 4 to drain region 8 owing to the tunnelling phenomenon.

In the nonvolatile semiconductor memory device thus constructed, silicon nitride film 5b does not function as an insulating film during the erase operation of the DINOR type nonvolatile semiconductor memory device, i.e., when electrons are injected into the floating gate electrode. Therefore, erasing can be easily performed with a low potential. While electric charges are held, as shown in FIG. 17, both silicon nitride film 5b and silicon oxide film 5c function as insulating films, so that external leak of electrons accumulated in floating gate electrode 4 is suppressed, and volatilization of data is suppressed.

Figure 18A:
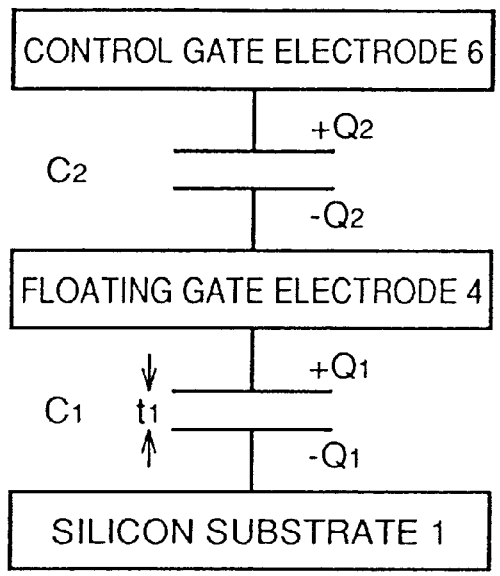
FIG. 18A is a circuit diagram of a nonvolatile semiconductor memory device in the prior art.

In the conventional nonvolatile semiconductor memory device shown in FIG. 18A, a capacitor having a capacity $C_2$ is formed between control gate electrode 6 and floating gate electrode 4, and charges of $+Q_2$ are accumulated in one of electrodes of the capacitor. Charges of $-Q_2$ are accumulated in the other electrode. A capacitor having a capacity C, is formed between floating gate electrode 4 and silicon substrate 1, and charges of $+Q_1$ are accumulated in one of electrodes of this capacitor. Charges of $-Q_1$ are accumulated in the other electrode. It is assumed that the electrodes of this capacitor are spaced from each other by a distance of $t_1$. In this circuit, silicon substrate 1 carries a potential of $V_S$, floating gate electrode 4 carries a potential of $V_F$, control gate electrode 6 carries a potential of $V_C$, and an electric field of $E_1$ exists between silicon substrate 1 and floating gate electrode 4. These satisfy the following relationships.

$$Q_1 = C_1(V_F - V_S)$$

$$Q_2 = C_2(V_C - V_F)$$

Assuming that $Q_1 = Q_2 = Q$, Q represents charges accumulated in floating gate electrode 4, and the above formulas can be modified as follows.

$$Q_1 - Q_2 = C_1(V_F - V_S) - C_2(V_C - V_F) = Q$$

$$V_F = (C_1 V_S + C_2 V_C + Q)/(C_1 + C_2)$$

$$E_1 = (V_F - V_S)/t_1$$
$$= (1/t_1)\{(C_2 V_C - C_2 V_S + Q)/(C_1 + C_2)\}$$
$$= (1/t_1)[\{(C_2(V_C - V_S) + Q\}/(C_1 + C_2)]$$

In order to improve the efficiency of injection of electrons from silicon substrate 1 into floating gate electrode 4, it is necessary to increase electric field $E_1$ between floating gate electrode 4 and silicon substrate 1. According to the above formulas, it is necessary to increase $\{C_2/(C_1+C_2)\}$ for increasing $E_1$. Usually, $C_2/(C_1+C_2)$ is in a range from 0.5 to 0.6.

Figure 18B:
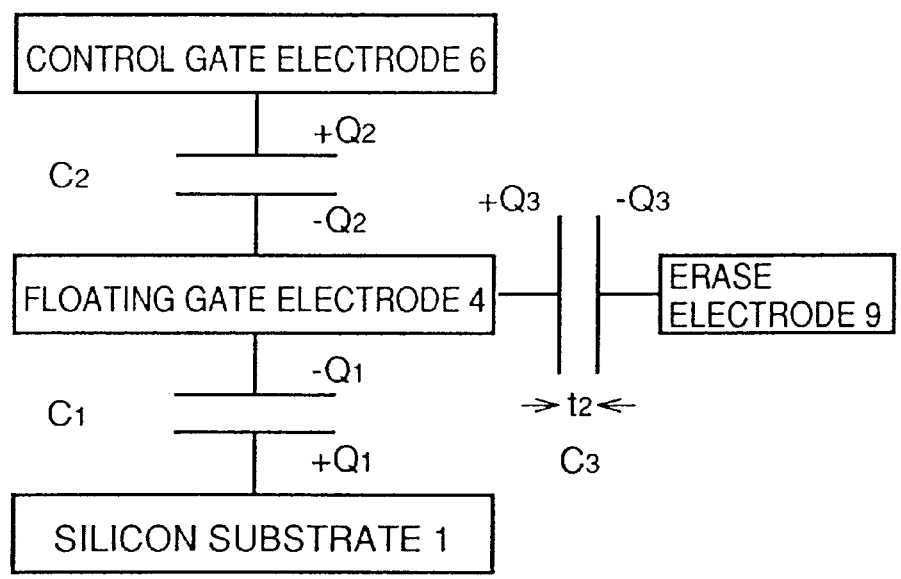
FIG. 18B is a circuit diagram showing a nonvolatile semiconductor memory device shown in FIG. 14.

In FIG. 18B, a capacitor having a capacity $C_2$ is formed between control gate electrode 6 and floating gate electrode 4. Charges of $+Q_2$ are accumulated in one of the electrodes of the capacitor, and charges Of $-Q_2$ are accumulated in the other electrode. A capacitor having a capacity $C_1$ is formed between floating gate electrode 4 and silicon substrate 1. Charges of $-Q_1$ are accumulated in one of the electrodes of this capacitor, and charges of $+Q_1$ are accumulated in the other electrode. A capacitor having a capacity $C_3$ is formed between floating gate electrode 4 and erase electrode 9. Charges of $+Q_3$ are accumulated in one of the electrodes of this capacitor, and charges of $-Q_3$ are accumulated in the other electrode. It is assumed that the electrodes of this capacitor are spaced from each other by a distance of $t_2$. Assuming that silicon substrate 1 carries a potential of $V_S$, floating gate electrode 4 carries a potential of $V_F$, control gate electrode 6 carries a potential of $V_C$, erase electrode 9 carries a potential of VE, and an electric field $E_2$ is formed between floating gate electrode 4 and erase electrode 9. These satisfy the following relationship.

$$Q_1 = C_1(V_S - V_F)$$

$$Q_2 = C_2(V_C - V_F)$$

$$Q_3 = C_3(V_F - V_E)$$

Assuming that a relationship of $(-Q_1 - Q_2 + Q_3) = Q$ is satisfied, Q represents charges accumulated in the floating gate electrode, and the above formula can be modified as follows.

$$-Q_1 - Q_2 + Q_3 = -C_1(V_S - V_F) - C_2(V_C - V_F) + C_3(V_F - V_E) = Q$$

$$Q = (C_1 + C_2 + C_3)V_F - C_1 V_S - C_2 V_C - C_3 V_E$$

$$V_F = (C_1 V_S + C_2 V_C + C_3 V_E + Q)/(C_1 + C_2 + C_3)$$

$$E_2 = (V_E - V_F)/t_2 = (1/t_2)\{(C_1 V_S + C_2 V_C - C_1 V_E - C_2 V_E + Q)/(C_1 + C_2 + C_3)\}$$

Assuming that $V_S = V_C = V$, the above formula can be modified as follows.

$$E_2 = (1/t_2)[\{(C_1 + C_2)(V - V_E) + Q\}/(C_1 + C_2 + C_3)]$$

According to the above formula, it is necessary to increase the electric field $E_2$ between floating gate electrode 4 and erase electrode 9 for increasing the efficiency of injection of electrons on floating gate electrode 4, and it is necessary to increase $\{(C_1+C_2)/(C_1+C_2+C_3)\}$ for increasing $E_2$. As can be seen from FIG. 4, an area through which floating gate electrode 4 and erase electrode 9 are opposed to each other is smaller that an area through which silicon substrate 1 and floating gate electrode 4 are opposed to each other and an area through which floating gate electrode 4 and control gate electrode 6 are opposed to each other. Therefore, $C_3$ is much smaller than $C_1$ and $C_2$, so that $(C_1+C_2)/(C_1+C_2+C_3)$ takes on a value near 1. As a result, electrons can be injected more easily into floating gate electrode 4 compared with the conventional nonvolatile semiconductor memory device shown in FIG. 18A. It should be noted that the applied voltages employed in the foregoing embodiment are mere examples.

Embodiment 4

In an embodiment 4, description will be given on a method of manufacturing the nonvolatile semiconductor memory device of the DINOR type described as the embodiment 3.

Figure 19:
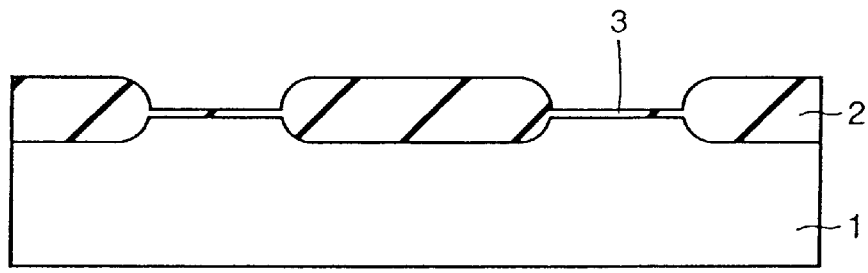
FIGS. 19 to 22 are cross sections showing 1st to 4th steps in a method of manufacturing a nonvolatile semiconductor memory device according to an embodiment 4, respectively.

Referring to FIG. 19, isolating oxide films 2 of 5000 Å in thickness are formed at silicon substrate 1 by the LOCOS method. At the active regions not covered with isolating oxide films 2, the natural oxide film is removed from the surface of silicon substrate 1, and gate oxide films 3 of 100 Å in thickness are formed by the thermal oxidation method.

Figure 20:
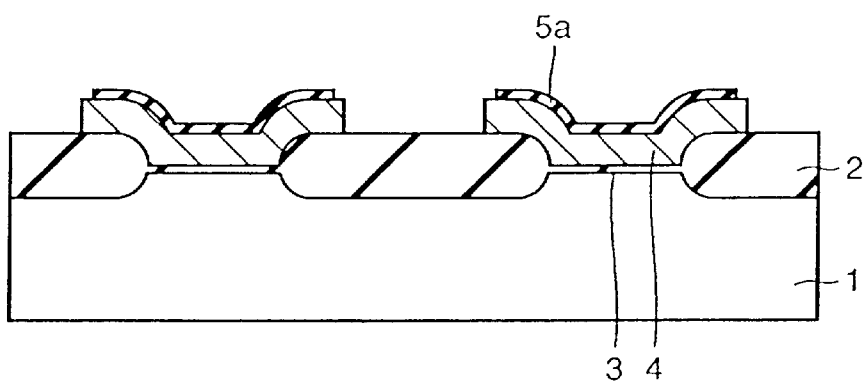

Referring to FIG. 20, a doped polycrystalline silicon layer of 1000 Å in thickness is deposited on silicon substrate 1 by the CVD method. This doped polycrystalline silicon layer is patterned into a predetermined configuration to form floating gate electrodes 4. A silicon oxide film of 100 Å in thickness is formed at the surface of floating gate electrode 4 by the thermal oxidation method. This silicon oxide film is patterned into a predetermined configuration to form-silicon oxide film 5a.

Figure 21:
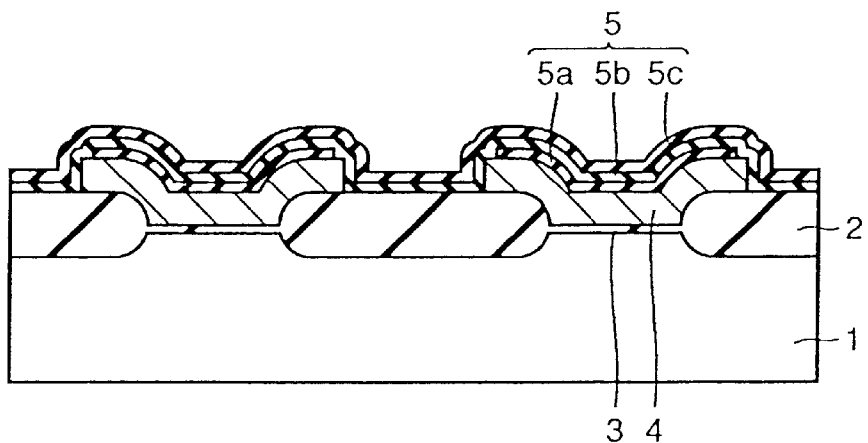

Referring to FIG. 21, the CVD method is performed to form silicon nitride film 5b of 100 Å in thickness covering isolating oxide film 2, floating gate electrode 4 and silicon oxide film 5a. Silicon oxide film 5c of 100 Å in thickness is formed on silicon nitride film 5b by the CVD method.

Figure 22:
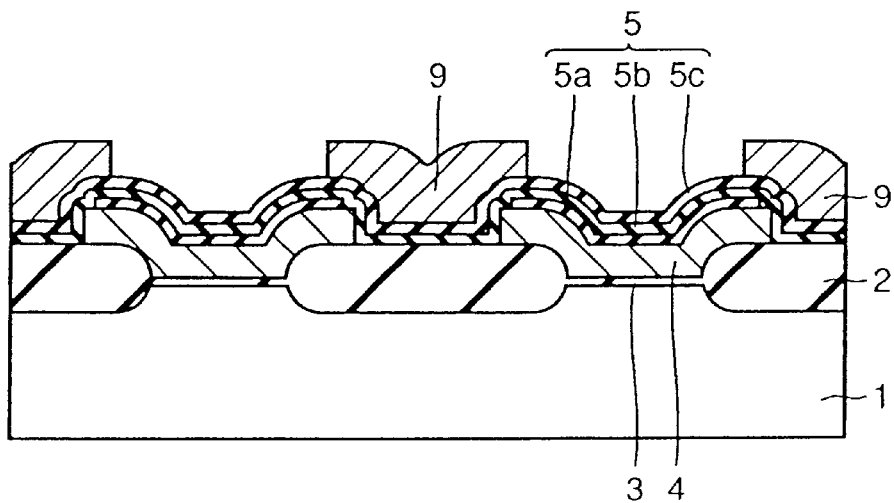

Referring to FIG. 22, a doped polycrystalline silicon layer of 1500 Å in thickness is deposited on silicon oxide films 5c by the CVD method, and is then patterned into a predetermined configuration to form erase electrodes 9.

Referring to FIG. 14, interlayer insulating film 10 is formed on erase electrode 9. A doped polycrystalline silicon layer of 1000 Å in thickness is formed over interlayer insulating film 10 and silicon oxide film 5c. A silicide layer of 1000 Å in thickness made of tungsten silicide or molybdenum silicide is formed on the doped polycrystalline silicon layer by a sputtering method. The silicide layer and the doped polycrystalline silicon layer are patterned into a predetermined configuration so that control gate electrode 6 made of doped polycrystalline silicon layer 6a and silicide layer 6b is formed. Interlayer insulating film 5 and floating gate electrode 4 which are located under and masked with control gate electrode 6 are etched with a gas, e.g., of $CHF_3$ or $CF_4$. Finally, interconnection layers for connection to control silicon substrate 1, gate electrodes 6 and erase electrodes 9 are formed, and then a final protective film is deposited so that the nonvolatile semiconductor memory device is completed.

The method of manufacturing the nonvolatile semiconductor memory device described above can manufacture the nonvolatile semiconductor memory device of the DINOR type having a good erasing efficiency through simple steps.

Embodiment 5

In the foregoing nonvolatile semiconductor memory device shown in FIG. 14, a portion of the upper surface of floating gate electrode 4 is in contact with silicon nitride film 5b and floating gate electrode 4. In a nonvolatile semiconductor memory device shown in FIG. 23, however, the upper surface of floating gate electrode 4 is not in contact with floating gate electrode 4 and the silicon nitride film. Structures of the nonvolatile semiconductor memory device shown in FIG. 23 other than the above are similar to those shown in FIG. 14. The nonvolatile semiconductor memory device shown in FIG. 23 can achieve an effect similar to that of the embodiment 3.

Embodiment 6

An embodiment 6 will be described below in connection with a method of manufacturing the nonvolatile semiconductor memory device shown in FIG. 23.

Figure 24:
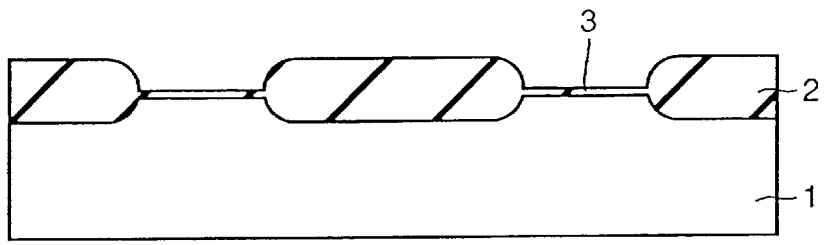
FIGS. 24 to 27 are cross sections showing 1st to 4th steps in a method of manufacturing a nonvolatile semiconductor memory device according to an embodiment 6, respectively.

Referring to FIG. 24, isolating oxide films 2 of 5000 Å in thickness are formed at the surface of silicon substrate 1 by the LOCOS method. At the active regions not covered with isolating oxide films 2, the natural oxide film is removed from the surface of silicon substrate 1, and gate oxide films 3 of 100 Å in thickness are formed by the thermal oxidation method.

Figure 25:
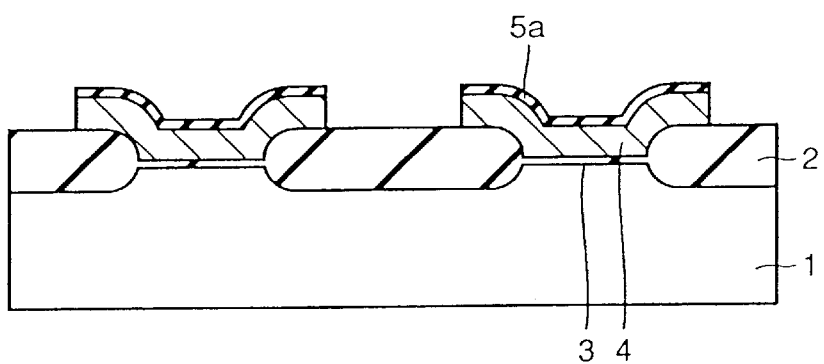

Referring to FIG. 25, a doped polycrystalline silicon layer of 1000 Å in thickness is deposited on the surface of silicon substrate 1 by the CVD method. A thermal oxide film of 100 Å in thickness is formed at the surface of this doped polycrystalline silicon layer by the thermal oxidation method. The thermal oxide film and the doped polycrystalline silicon film are patterned by photolithographic processing to form floating gate electrode 4 and silicon oxide film 5a.

Figure 26:
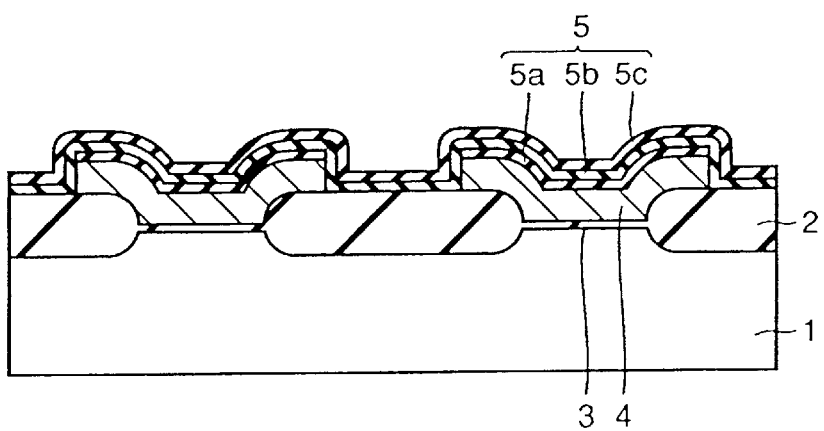

Referring to FIG. 26, the CVD method is performed to form silicon nitride film 5b of 100 Å in thickness covering silicon oxide film 5a, the side surfaces of floating gate electrode 4 and isolating oxide film 2. Silicon oxide film 5c of 100 Å in thickness is deposited on silicon nitride film 5b.

Figure 27:
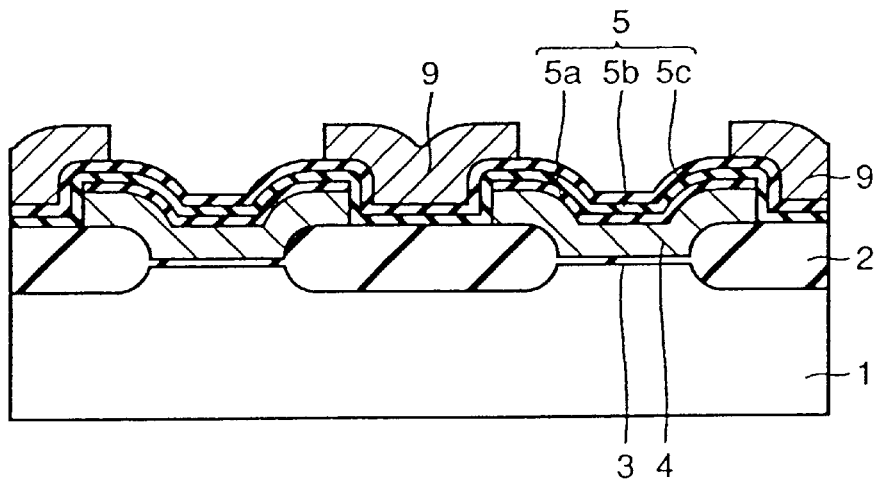

Referring to FIG. 27, a doped polycrystalline silicon layer of 1500 Å in thickness covering silicon oxide film 5c is deposited by the CVD method. The doped polycrystalline silicon layer is patterned into a predetermined configuration to form erase electrodes 9.

Figure 23:
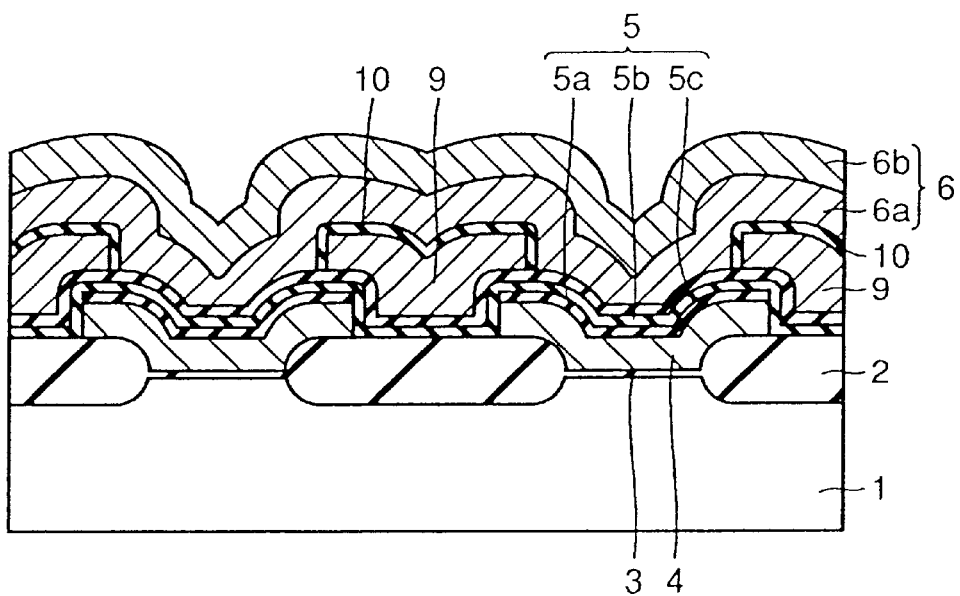
FIG. 23 is a cross section showing a nonvolatile semiconductor memory device according to an embodiment 5.

Referring to FIG. 23, interlayer insulating film 10 is deposited on the surface of erase electrode 9. A doped polycrystalline silicon layer of 1000 Å in thickness is formed over interlayer insulating film 10 and silicon oxide film 5c by the CVD method. A silicide layer made of tungsten silicide or molybdenum silicide is formed on the doped polycrystalline silicon layer by a sputtering method. The silicide layer and the doped polycrystalline silicon layer are patterned into a predetermined configuration so that control gate electrode 6 made of silicide layer 6a and doped polycrystalline silicon layer 6b is formed. Finally, interconnection layers for connection to silicon substrate 1 and control gate electrodes 6 are formed, and then a final protective film is deposited so that the nonvolatile semiconductor memory device shown in FIG. 23 is completed.

This method can achieve the same effect as that by the embodiment 4. Since the patterning is effected on the floating gate electrode 4 and silicon oxide film 5a in the layered form, the manufacturing steps can be smaller in number that those in the embodiment 4. In the embodiment 4, the patterning of silicon oxide film 5a must be performed to leave only a predetermined portion located on floating gate electrode 4. In contrast to this, the method of the embodiment 6 can be performed without taking such superposition into consideration, and floating gate electrode 4 can be formed with the same pattern as that for patterning silicon oxide film 5a.

Embodiment 7

Figure 28:
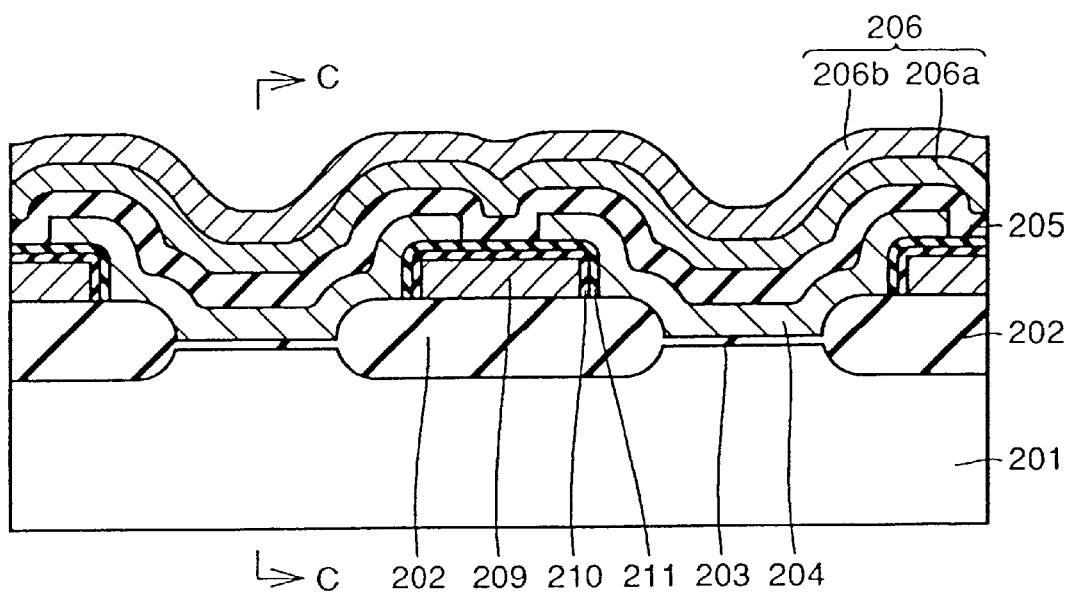
FIG. 28 is a cross section showing a nonvolatile semiconductor memory device according to an embodiment 7.

Referring to FIG. 28, a plurality of isolating oxide films 202 are formed on a silicon substrate 201 with a space between each other. Silicon oxide films 203 are formed at portions of the surface of silicon substrate 1 not covered with isolating oxide films 202. An erase electrode 209 made of doped polycrystalline silicon is formed directly on each isolating oxide film 202. Erase electrode 209 extends perpendicularly to the sheet of FIG. 28. Erase electrode 209 is covered with silicon oxide film 210 and silicon nitride film 211. Gate oxide film 203, interlayer oxide film 202 and silicon nitride film 211 are covered with a floating gate electrode 204 made of doped polycrystalline silicon. Floating gate electrodes 204 are isolated from each other by isolating oxide films 202. Floating gate electrode 204 and silicon oxide film 211 are covered with an interlayer insulating film 205. Interlayer insulating film 205 is formed of a silicon oxide film, a silicon nitride film and a silicon oxide film layered in this order from the bottom to the top. Interlayer insulating film 205 is covered with a control gate electrode 206 formed of a doped polycrystalline silicon layer 206a and a silicide layer 206b. Control gate electrode 206 extends perpendicularly to erase electrode 209. Erase electrode 209 is formed under floating gate electrode 204.

A cross section taken along line C—C in FIG. 28 is similar to that in FIG. 3.

The nonvolatile semiconductor memory device having the above structure can achieve an effect similar to that by the nonvolatile semiconductor memory device of the embodiment 1.

A method of manufacturing the nonvolatile semiconductor memory device of the embodiment 7 will be described below.

Figure 29:
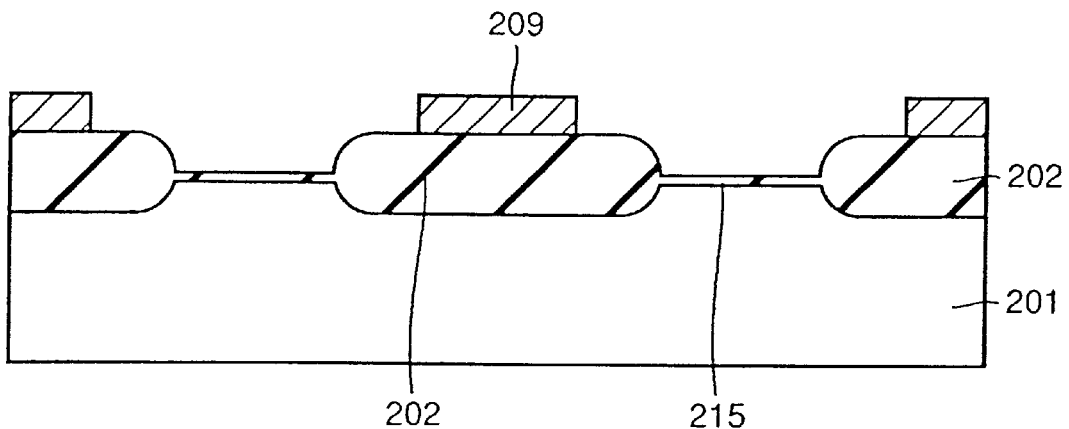
FIGS. 29 to 31 are cross sections showing 1st to 3rd steps in a method of manufacturing the nonvolatile semiconductor memory device according to the embodiment 7, respectively.

Referring to FIG. 29, isolating oxide films 202 of 5000 Å in thickness are formed at the surface of silicon substrate 201 by the LOCOS method. At the active regions not covered with isolating oxide films 202, the natural oxide film is removed from the surface of silicon substrate 201, and silicon oxide films 215 of 200 Å in thickness are formed at the surface of silicon substrate 201 by the thermal oxidation method. A doped polycrystalline silicon layer of 1500 Å in thickness covering silicon oxide film 215 and isolating oxide film 202 is deposited by the CVD method. This doped polycrystalline silicon layer is patterned to leave the doped polycrystalline silicon layer forming erase electrode 209 on each isolating oxide film 202.

Figure 30:
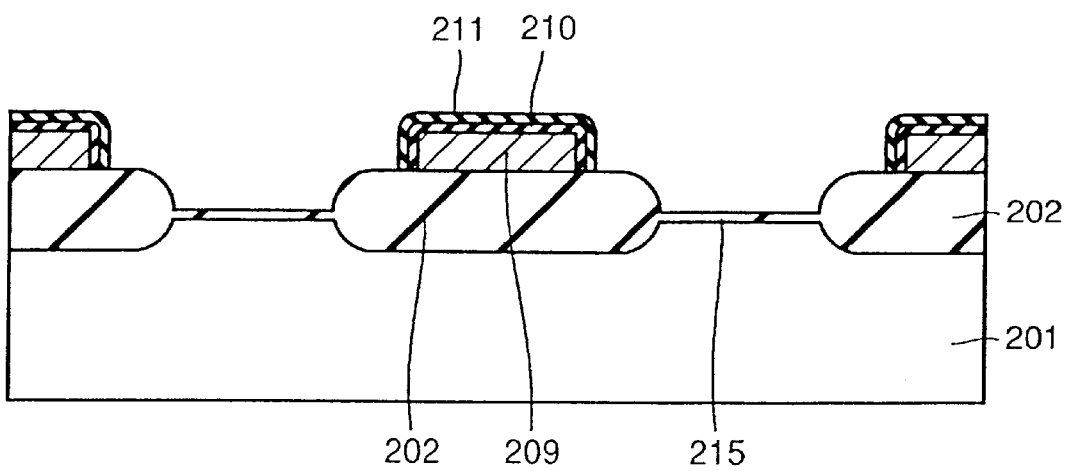

Referring to FIG. 30, silicon oxide film 210 of 100 Å in thickness covering erase electrode 209 is formed by the thermal oxidation method, and then is patterned into a predetermined configuration to form silicon nitride film 211. Then, silicon oxide film 215 is removed, and silicon oxide film 203 of 100 Å in thickness is formed by the thermal oxidation method.

Figure 31:
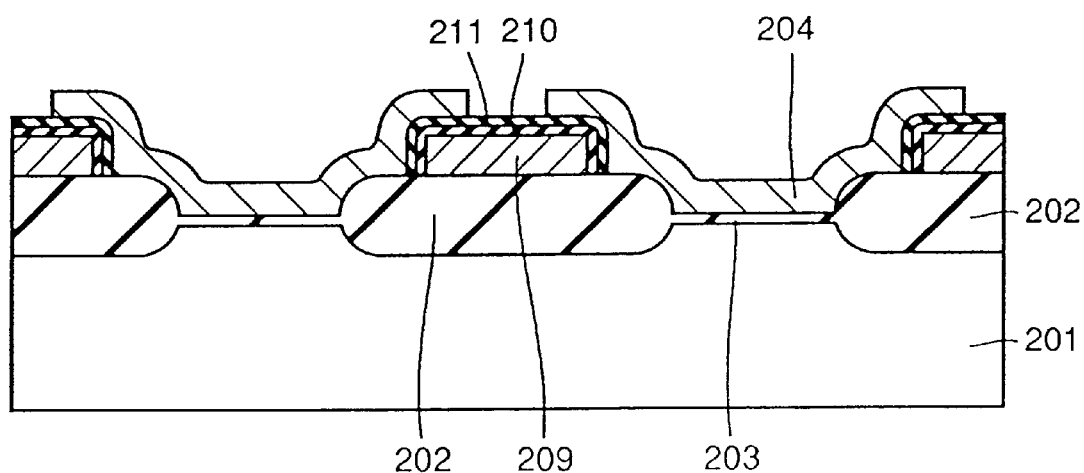

Referring to FIG. 31, the CVD method is performed to form a doped polycrystalline silicon layer of 1000 Å in thickness covering silicon oxide film 203, silicon nitride film 211 and isolating oxide film 202. The doped polycrystalline silicon layer is patterned into a predetermined configuration to form floating gate electrode 204.

Referring to FIG. 28, a silicon oxide film is formed at the surface of floating gate electrode 204 by the thermal oxidation method, and a silicon nitride film is formed on this silicon oxide film by the CVD method. A silicon oxide film is formed on this silicon nitride film by the CVD method, so that interlayer insulating film 205 is formed. A doped polycrystalline silicon layer of 1000 Å in thickness is deposited on interlayer insulating film 205 by the CVD method. A silicide layer 1000 Å in thickness made of tungsten silicide or molybdenum silicide is formed on the doped polycrystalline silicon layer by the sputtering method. The silicide layer and the doped polycrystalline silicon layer are patterned into a predetermined configuration to form control gate electrode 206 made of doped polycrystalline silicon layer 206a and silicide layer 206b. Interlayer insulating film 205 and floating gate electrode 204 which are located under and masked with control gate electrode 206 are etched with a gas, e.g., of $CHF_3$ or $CF_4$. Finally, interconnection layers for connection to silicon substrate 201, control gate electrodes 206 and erase electrodes 209 are formed, and then a final protective film is deposited to complete the nonvolatile semiconductor memory device.

The method of manufacturing the nonvolatile semiconductor memory device can be executed with simple steps to provide the nonvolatile semiconductor memory device which allows easy extraction of electrons from the floating gate electrode and can suppress volatilization of data.

Example for Comparison

Figure 32:
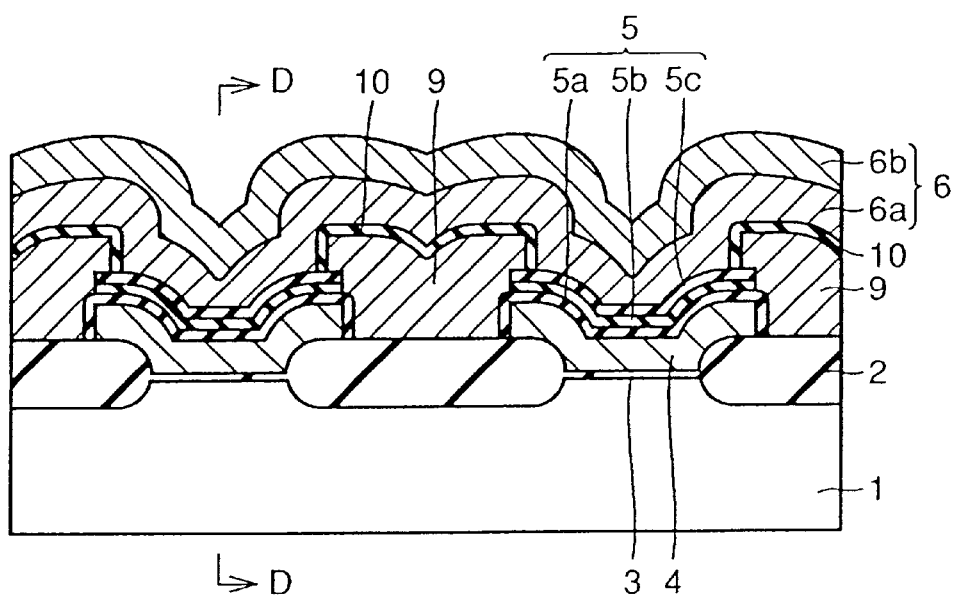
FIG. 32 is a cross section showing a nonvolatile semiconductor memory device of an example for comparison with the invention.

In the nonvolatile semiconductor memory device already described with reference to FIG. 3, silicon oxide film 5a and silicon nitride film 5b are formed between floating gate electrode 4 and erase electrode 9. In contrast to this, a nonvolatile semiconductor memory device shown in FIG. 32 has a portion, at which silicon nitride film 5b is not present, between floating gate electrode 4 and erase electrode 9. A cross section taken along line taken along line D—D in FIG. 32 is similar to that in FIG. 3. A method of manufacturing the nonvolatile semiconductor memory device shown in FIG. 32 will now be described below.

Figure 33:
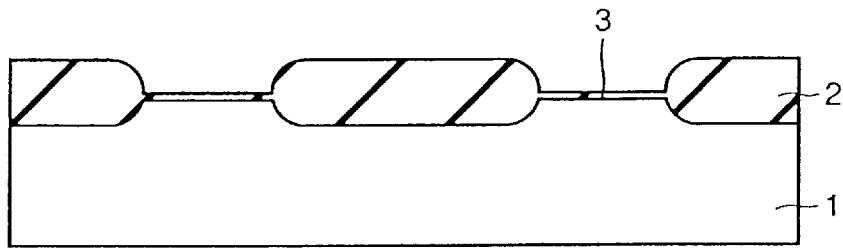
FIGS. 33 to 37 are cross sections showing 1st to 5th steps in a method of manufacturing a nonvolatile semiconductor memory device shown in FIG. 32, respectively.

Referring to FIG. 33, isolating oxide films 2 of 5000 Å in thickness are formed at the surface of silicon substrate 1 by the LOCOS method. At regions not covered with isolating oxide films 2, a natural oxide film is removed from silicon substrate 1, and gate oxide films 3 of 100 Å in thickness are formed at the surface of silicon substrate 1.

Figure 34:
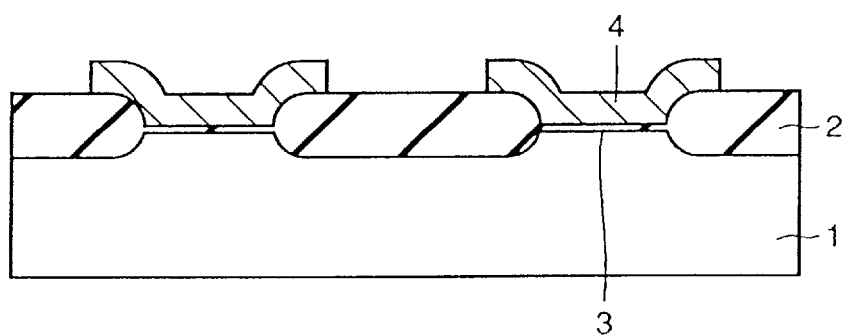

Referring to FIG. 34, a doped polycrystalline silicon layer of 1000 Å in thickness covering gate oxide films 3 and isolating oxide films 2 is deposited by the CVD method. This doped polycrystalline silicon layer is patterned into a predetermined configuration to form floating gate electrodes 4.

Figure 35:
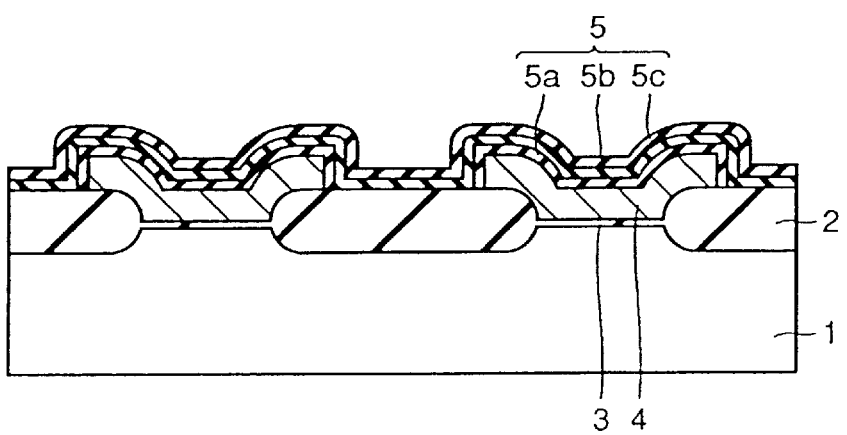

Referring to FIG. 35, silicon oxide film 5a of 100 Å in thickness is formed at the surface of each floating gate electrode 4 by the thermal oxidation method. Silicon nitride film 5b of 100 Å in thickness covering silicon oxide films 5a and isolating oxide films 2 is formed by the CVD method. Silicon oxide film 5c of 100 Å in thickness covering silicon nitride film 5b is formed by the CVD method.

Figure 36:
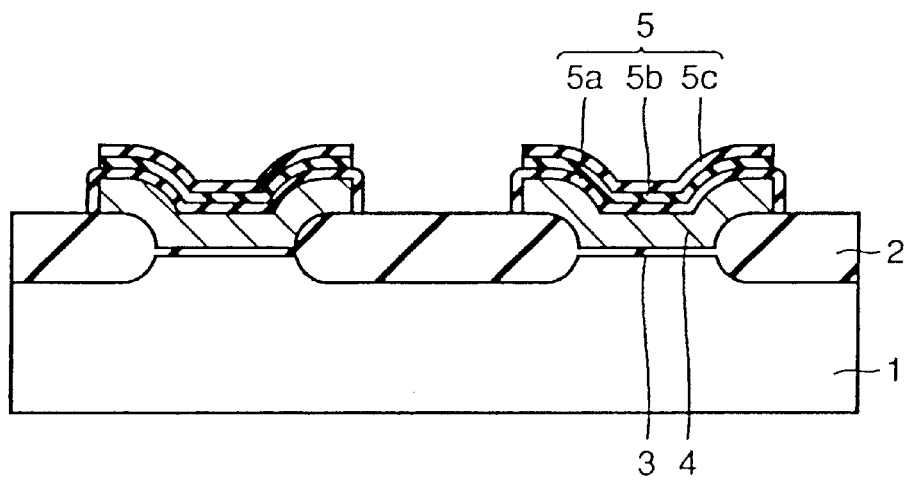

Referring to FIG. 36, silicon oxide film 5c is partially and selectively etched with a hydrofluoric acid (HF) solution. Then, silicon nitride film 5b is partially and selectively etched with a gas, e.g., of $CF_4$. Thereby, silicon nitride film 5b and silicon oxide film 5c are removed from a portion of the upper surface and the side surfaces of floating gate electrode 4. Then, the thermal oxidation method is performed to grow silicon oxide film 5a at a portion not in contact with silicon nitride film 5b.

Figure 37:
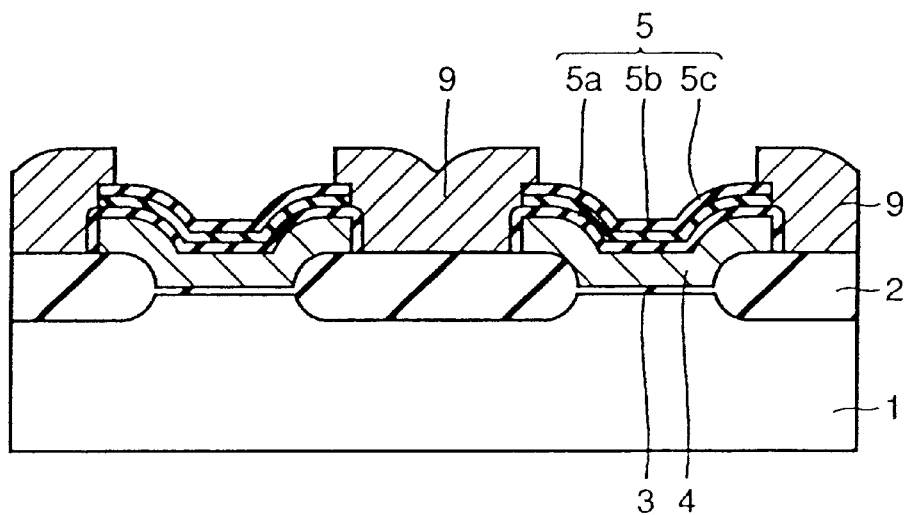
Figure 38:
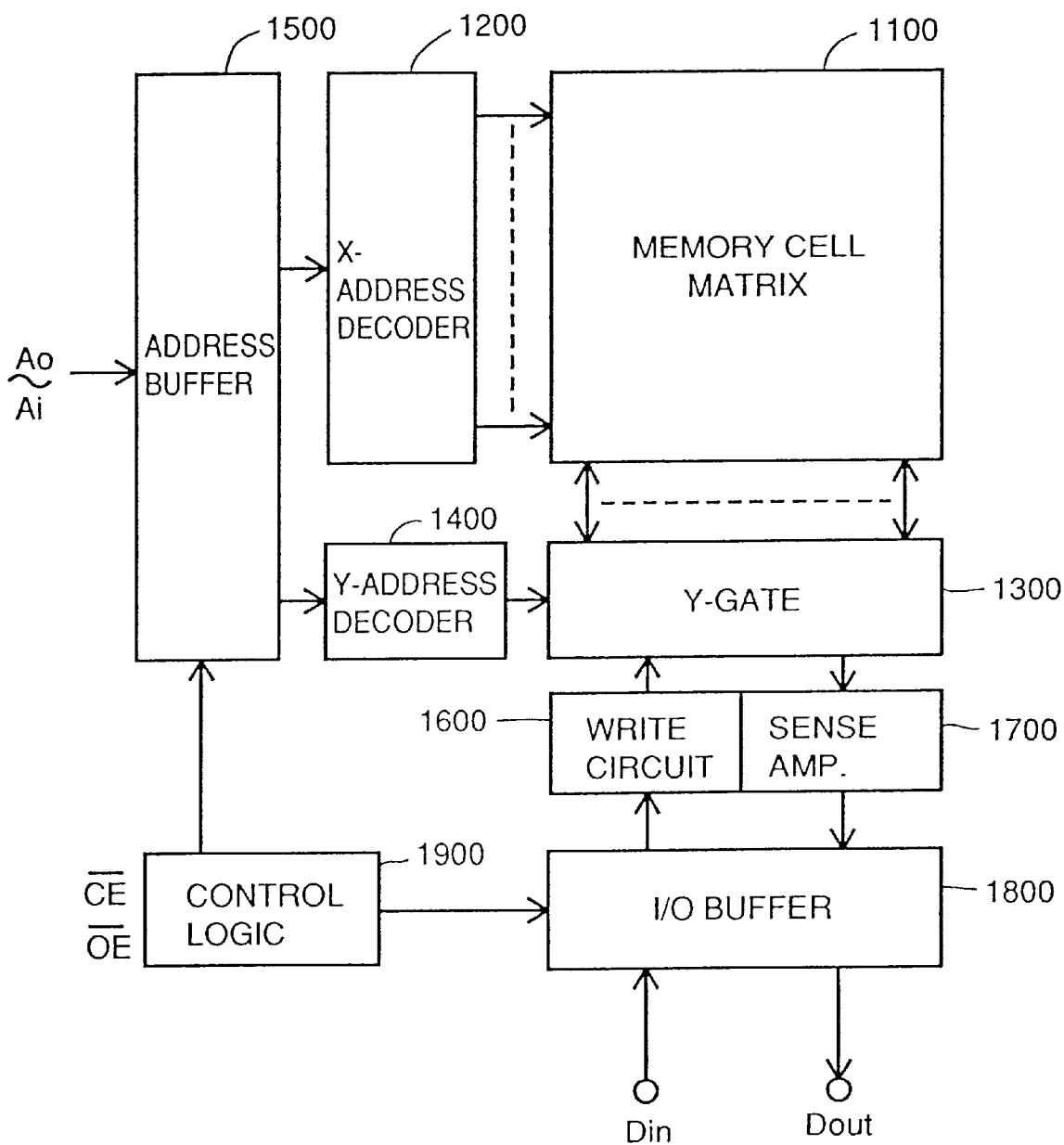
FIG. 38 is a block diagram showing a structure of a general flash memory in the prior art.
Figure 39:
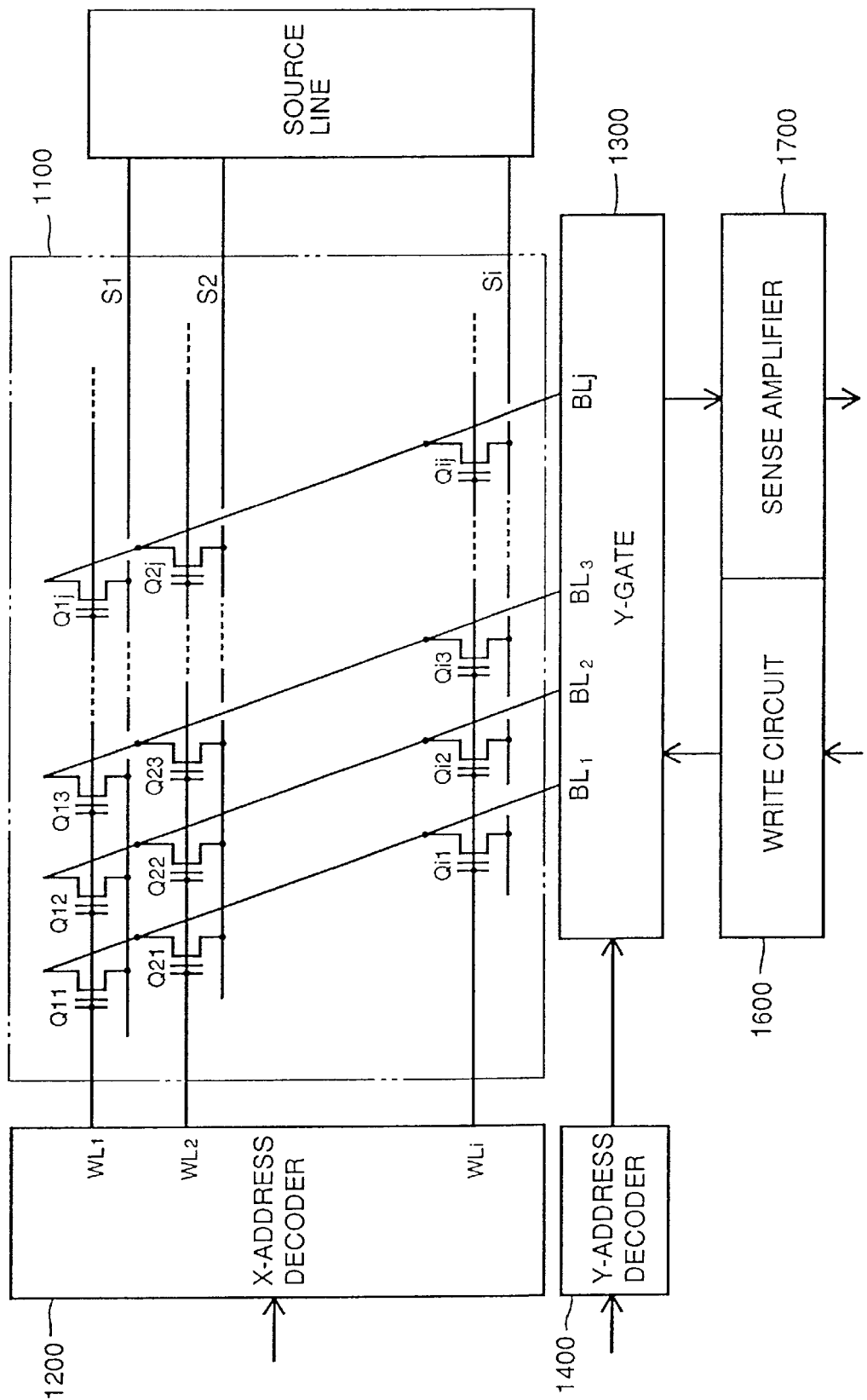
FIG. 39 is an equivalent circuit diagram showing a schematic structure of a memory matrix shown in FIG. 38.
Figure 40:
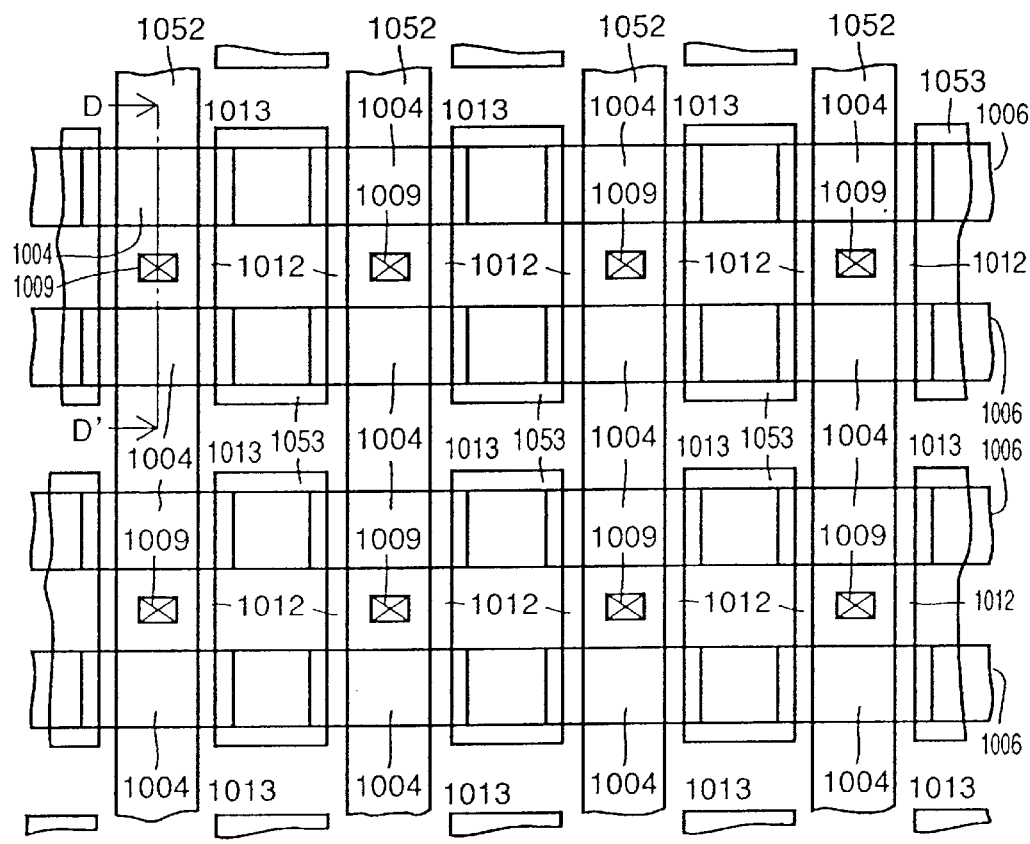
FIG. 40 is a fragmentary plan showing a schematic structure of a memory cell matrix of a flash memory in the prior art.
Figure 41:
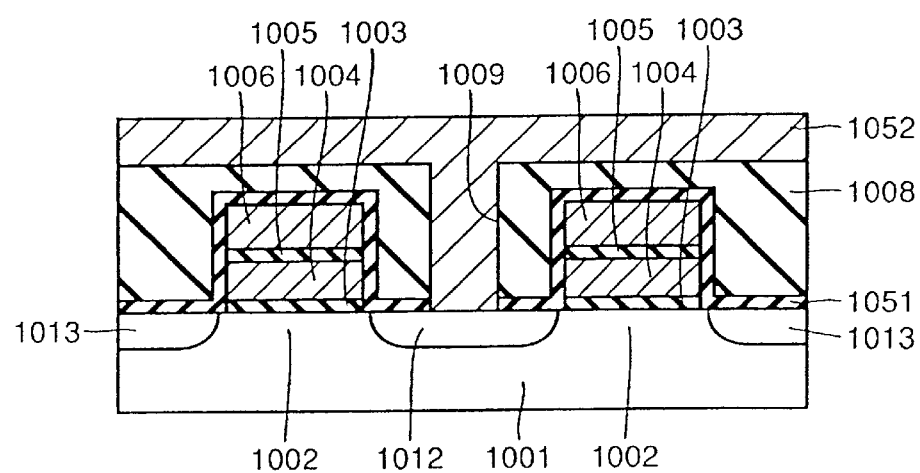
FIG. 41 is a cross section taken along line D–D' in FIG. 40.
Figure 42:
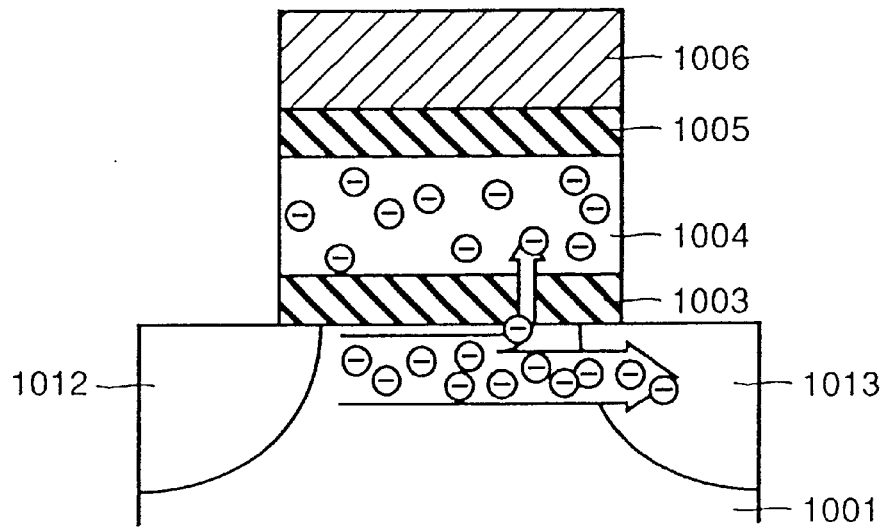
FIG. 42 shows a write operation of a flash EEPROM utilizing channel hot electrons.
Figure 43:
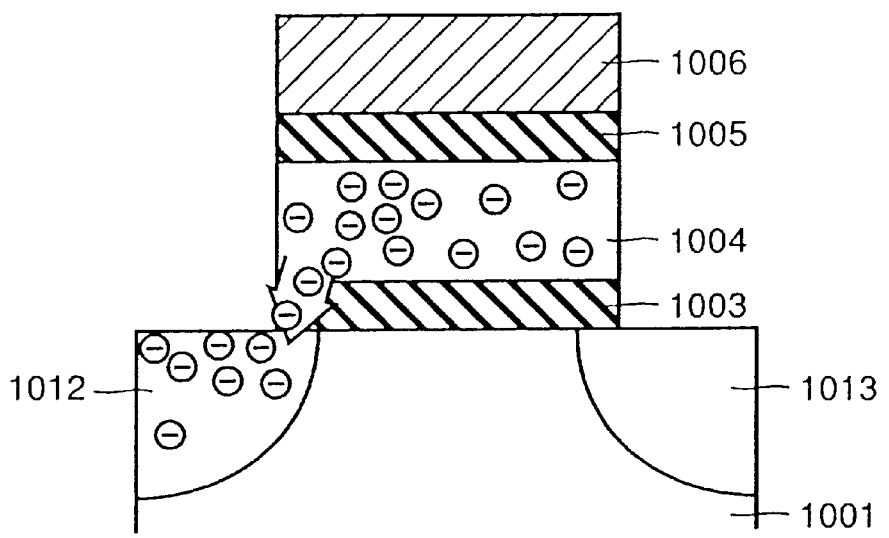
FIG. 43 shows an erase operation utilizing a F–N tunneling phenomenon.
Figure 44:
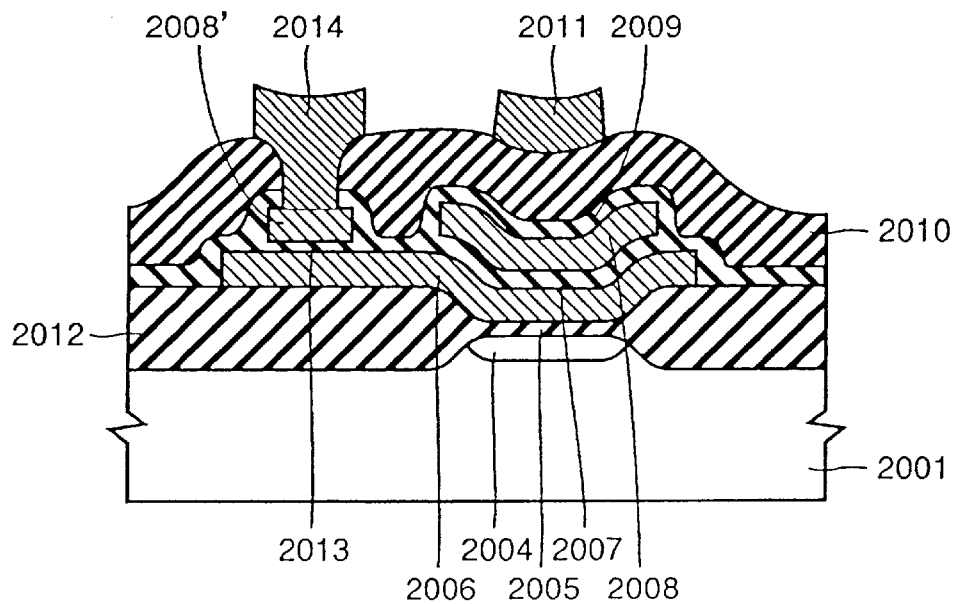
FIG. 44 is a cross section showing a conventional nonvolatile semiconductor memory device having an injection gate.
Figure 45:
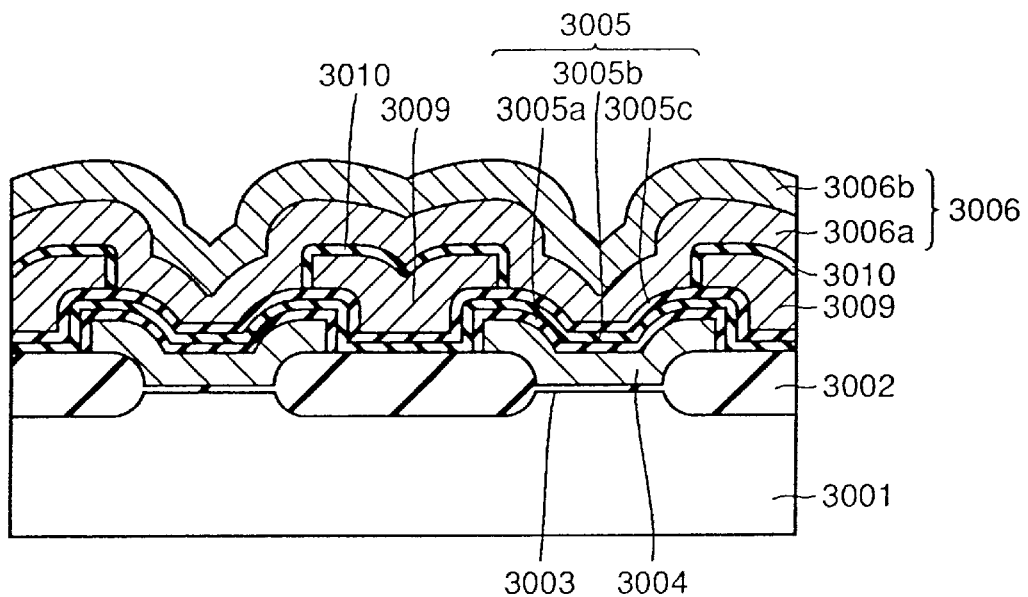
FIG. 45 is a cross section showing a nonvolatile semiconductor memory device proposed by the inventors and others.

Referring to FIG. 37, a doped polycrystalline silicon layer of 1500 Å in thickness covering silicon substrate 1 is formed by the CVD method. The doped polycrystalline silicon layer is patterned into a predetermined configuration to form erase electrodes 9.

Referring to FIG. 32, the thermal oxidation method is performed to form interlayer insulating film 10 at on the surface of erase electrode 9. Thereafter, control gate electrode 6 made of doped polycrystalline silicon layer 6a and silicide layer 6b is formed similarly to the embodiment 1. Interconnection layers for connection to silicon substrate 1, erase electrodes 9 and control gate electrodes 6 are formed, and a final protective film is deposited so that the semiconductor device is completed.

According to the method of manufacturing the nonvolatile semiconductor memory device described above, the film thickness of silicon oxide film 5a may be controlled in the step shown in FIG. 36, whereby the degree of allowing extraction of electrons can be controlled independently of the current leak properties of the interlayer insulating film 5.

Although the embodiments of the invention have been described, these embodiments can be modified into various forms. First, the film thicknesses and materials can be appropriately changed, in necessary. In the embodiment 7, silicon oxide film 210 can be formed on erase electrode 209, and silicon nitride film 211 is formed on silicon oxide film 210. In contrast to this, a silicon nitride film may be formed on erase electrode 209, and a silicon oxide film may be formed on this silicon nitride film. In the embodiment 1, the natural oxide film is left on the surface of the silicon nitride film. However, this natural oxide film may be removed.

Although the present invention has been described and illustrated in detail, it is clearly understood that the same is by way of illustration and example only and is not to be taken by way of limitation, the spirit and scope of the present invention being limited only by the terms of the appended claims. For example, the film thicknesses, the voltages applied to various portions and others may be changed, if necessary in design.

What is claimed is:

1. A nonvolatile semiconductor memory device comprising:
   a semiconductor substrate;
   a floating gate electrode formed on said semiconductor substrate with a first insulating film therebetween;
   a control gate electrode formed on a portion of said floating gate electrode with a second insulating film therebetween; and
   an erase electrode formed on another portion of said floating gate electrode with a third insulating film therebetween; wherein,
   said second insulating film includes a first silicon oxide film, a silicon nitride film formed on said first silicon oxide film and a second silicon oxide film formed on said silicon nitride film, and a portion of said third insulating film includes said first silicon oxide film on said floating gate electrode, and said silicon nitride film formed on said first silicon oxide film but excludes said second silicon oxide film.

2. The nonvolatile semiconductor memory device according to claim 1, further comprising an isolating oxide film for isolating the memory cells from each other, wherein said erase electrode is formed on said isolating oxide film.

3. The nonvolatile semiconductor memory device according to claim 1, wherein said nonvolatile semiconductor memory device comprises a plurality of said floating gate electrodes, and said erase electrode is arranged between said floating gate electrodes neighboring to each other.

4. The nonvolatile semiconductor memory device according to claim 1, wherein said control gate electrode is formed on said erase electrode.

5. A nonvolatile semiconductor memory device comprising:

a semiconductor substrate;

a floating gate electrode formed on said semiconductor substrate with a first insulating film therebetween;

a control gate electrode formed on a portion of said floating gate electrode with a second insulating film therebetween; and an erase electrode formed on another portion of said floating gate electrode with a third insulating film therebetween, wherein, said second insulating film includes a first silicon oxide film, a silicon nitride film formed on said first silicon oxide film, and a second silicon oxide film formed on said silicon nitride film, and a portion of said third insulating film includes said silicon nitride film formed on said floating gate electrode, and said second silicon oxide film formed on said silicon nitride film but excludes said first silicon oxide film.

6. The nonvolatile semiconductor memory device according to claim 5, further comprising an isolating oxide film for isolating memory cells from each other, wherein said erase electrode is formed on said isolating oxide film.

7. The nonvolatile semiconductor memory device according to claim 5, wherein said nonvolatile semiconductor memory device comprises a plurality of said floating gate electrodes, and said erase electrode is arranged between said floating gate electrodes neighboring to each other.

8. The nonvolatile semiconductor memory device according to claim 5, wherein said control gate electrode is formed on said erase electrode.

* * * * *

UNITED STATES PATENT AND TRADEMARK OFFICE
CERTIFICATE OF CORRECTION

PATENT NO. : 6,329,688 B1
DATED : December 11, 2001
INVENTOR(S) : Hajime Arai

Page 1 of 1

It is certified that error appears in the above-identified patent and that said Letters Patent is hereby corrected as shown below:

<u>Title page,</u>
Foreign Patent Documents, change "63-244364" to -- 63-244367 --

Signed and Sealed this

Twenty-eighth Day of May, 2002

Attest:

Attesting Officer

JAMES E. ROGAN
*Director of the United States Patent and Trademark Office*